United States Patent
Nakanishi et al.

(10) Patent No.: US 6,492,195 B2
(45) Date of Patent: Dec. 10, 2002

(54) METHOD OF THINNING A SEMICONDUCTOR SUBSTRATE USING A PERFORATED SUPPORT SUBSTRATE

(75) Inventors: Masaki Nakanishi, Saku (JP); Susumu Sorimachi, Komoro (JP); Kiichi Yamashita, Shiroyama (JP); Hiroji Yamada, Shiroyama (JP); Kikuo Fukushima, Ome (JP)

(73) Assignees: Hitachi, Ltd., Tokyo (JP); Hitachi Tohbu Semiconductor, Ltd., Gunma (JP)

(*) Notice: Subject to any disclaimer, the term of this patent is extended or adjusted under 35 U.S.C. 154(b) by 0 days.

(21) Appl. No.: 09/734,927

(22) Filed: Dec. 13, 2000

(65) Prior Publication Data

US 2001/0005043 A1 Jun. 28, 2001

(30) Foreign Application Priority Data

Dec. 24, 1999 (JP) .......................... 11-367942

(51) Int. Cl.$^7$ ............................................... H01L 21/44
(52) U.S. Cl. ..................... 438/106; 438/107; 438/110; 438/113; 438/118; 438/120; 438/122; 438/406; 438/455; 438/458; 438/459
(58) Field of Search ................................ 438/106, 107, 438/110, 113, 114, 115, 118, 119, 120, 121, 122, 977, 406, 455, 458, 459

(56) References Cited

U.S. PATENT DOCUMENTS

| | | | | |
|---|---|---|---|---|
| 3,559,855 A | * | 2/1971 | Barnett et al. | 225/2 |
| 5,753,537 A | * | 5/1998 | Dekker et al. | 438/113 |
| 5,919,713 A | * | 7/1999 | Ishii et al. | 437/227 |
| 6,013,534 A | * | 1/2000 | Mountain | 438/15 |
| 6,221,751 B1 | * | 4/2001 | Chen et al. | 438/612 |

FOREIGN PATENT DOCUMENTS

| | | | | |
|---|---|---|---|---|
| JP | 356055059 A | * | 5/1981 | |
| JP | 405082491 A | * | 4/1993 | |
| JP | 5-335292 | | 12/1993 | |
| JP | 7-037768 | | 2/1995 | |
| JP | 7-221051 | | 8/1995 | |
| JP | 10-294246 | | 11/1998 | |

* cited by examiner

*Primary Examiner*—Carl Whitehead, Jr.
*Assistant Examiner*—Khanh B. Duong
(74) *Attorney, Agent, or Firm*—Mattingly, Stanger & Malur, P.C.

(57) ABSTRACT

Disclosed herein is a technique which performs the thinning of a wafer and the separation thereof from a support substrate with high yields and in a short time. Described specifically, a hole-free support substrate is bonded to a second surface of a support substrate having holes with an adhesive layer melted by heating so as to bloc the holes. A wafer is bonded to a first surface of the support substrate having the holes with an adhesive layer melted by solvent. The wafer is thinned by grinding and etching. The adhesive layer is melted by heating and the support substrate having the holes is slid with respect to the hole-free support substrate to thereby separate the support substrate having the holes from the hole-free support substrate. Further, the adhesive layer is melted by solvent from the holes defined in the support substrate having the holes to thereby separate the wafer from the support substrate having the holes. Since the separation of the hole-free support substrate from the support substrate having the holes depends on heating and sliding, it can be carried out in a short time. Since the adhesive layer is melted by solvent which enters through the holes, the separation of the wafer in a short time is allowed. Both work do not put a load on the wafer and hence damage is prevented from occurring.

31 Claims, 13 Drawing Sheets

METHOD OF THINNING A SEMICONDUCTOR SUBSTRATE USING A PERFORATED SUPPORT SUBSTRATE

BACKGROUND OF THE INVENTION

The present invention relates to a semiconductor device and a method of manufacturing it, and particularly to a technology effective for application to a technology for grinding the back of a semiconductor substrate (semiconductor wafer) with semiconductor elements formed thereon to thereby thin the semiconductor substrate.

As semiconductor elements operated at high speed, for example, a GaAs-MESFET (Metal Semiconductor Field Effect Transistor), an HEMT (High Electron Mobility Transistor), and an HBT (Hetero Junction Bipolar Transistor) are used in a high-frequency power amplifying module built in a radio communication apparatus such as a cellular phone system.

As for these semiconductor elements, there is known one which adopts a so-called PHS (Plated Heat Sink) wherein via holes extending from the surface (main surface) of a semiconductor substrate to the back thereof are provided and conductors are provided in the via holes to electrically connect predetermined electrodes on the surface of the semiconductor substrate to a metal layer provided on the back of the semiconductor substrate, and in which the thickness of the semiconductor substrate is made thin and the length of each via hole is shortened to reduce inductance, whereby an increase in high-frequency characteristic is achieved.

A technology for thinning the semiconductor substrate to 100 μm or less has been disclosed in, for example, Japanese Patent Application Laid-Open Nos. Hei 10(1998)-294246 and Hei 5(1993)-335292. The former publication has described a method of increasing the temperature of wax to the neighborhood of a melting point after the thinning of a semiconductor substrate bonded to a reinforcing plate with wax has been completed, and peeling the semiconductor substrate from the reinforcing plate while the wax is being melted.

A technology for thinning the semiconductor substrate to 25 μm has been disclosed in Japanese Patent Application Laid-Open No. Hei 7(1995)-221051. This reference describes a GaAsFET used for ultra high-frequency applications. The GaAsFET has a PHS structure wherein a metal layer, which acts as a heat sink, is provided on the reverse side (back) of a semiconductor substrate. Further, the present reference also discloses a technology for bonding the surface of the semiconductor substrate to a protective plate such as glass with wax and thereafter the wax is melted by solvent to separate a semiconductor chip brought to a PHS structure from a glass substrate.

SUMMARY OF THE INVENTION

Thinning a semiconductor element (semiconductor chip) built in a high-frequency power amplifying module (high-frequency power amplifier) is essential for improvements in high-frequency characteristics and heat dissipation.

Conventionally, a compound semiconductor substrate (semiconductor wafer: also called simply "wafer") such as GaAs or the like on which transistors such as a GaAs-MESFET, an HEMT, an HBT, etc. are formed, is prepared and thereafter the semiconductor wafer is fixed to a support substrate such as a glass substrate with an adhesive layer such as wax, followed by thinning of the semiconductor wafer.

(1) A method of heating and melting the wax to peel the semiconductor wafer from the glass substrate and (2) a method of melting the wax by solvent to separate the semiconductor wafer from the glass substrate have been adopted for the separation of the semiconductor wafer from the glass substrate.

In the former heating method, however, the semiconductor wafer must be separated by applying an external force thereto, and the thinned wafer is often cracked and broken, thus interfering with an improvement in yields.

In the latter solvent-based melting method, since the solvent is hard to sink in the wax, the time required to perfectly separate the semiconductor wafer from the glass substrate is spent and hence productivity is low. In the case of a wafer having a diameter of 3 inches, for example, about one week is required for its separation. Incidentally, there is known a technique (Japanese Patent Application Laid-Open No. Hei 7(1995)-37768) wherein trenches are defined in the surface of a reinforcing member (support substrate) and bubbles developed in an adhesive for bonding the reinforcing member and a wafer to each other are caused to escape to the outside through the trenches. When the reinforcing member is used for the support substrate, a manufacturing process (e.g., PHS structure manufacturing process) for effecting back processing such as plating on the back of a wafer after the thinning of the wafer to thereby form an electrode layer has the potential of melting out wax from trenches and thereby deteriorating the quality of a plated film.

An object of the present invention is to provide a technology for manufacturing a semiconductor device, which is capable of performing the thinning of a semiconductor wafer and the separation of it from a support substrate with high yields.

Another object of the present invention is to provide a technology for manufacturing a semiconductor device, which is capable of performing the thinning of a semiconductor wafer and the separation of it from a support substrate in a short time.

A further object of the present invention is to provide a method of manufacturing a semiconductor device, which is capable of manufacturing a semiconductor chip having a PHS structure with high yields and in a short time.

The above, other objects, and novel features of the present invention will become apparent from the description of the present specification and the accompanying drawings.

A summary of a typical one of the inventions disclosed in the present application will be described in brief as follows:

The present invention includes the steps of:
preparing a support substrate having a first surface and a second surface opposite to the first surface and having a plurality of holes extending from the first surface to the second surface, a hole-free support substrate having a first surface and a second surface opposite to the first surface, and a semiconductor wafer which has a main surface and a back opposite to the main surface, and semiconductor elements formed in each individuals of a plurality of semiconductor chip forming areas, and which has, on the main surface, an etching stopper layer comprised of a conductor electrically connected to a predetermined electrode constituting each semiconductor element, and a metal layer provided so as to overlap with a scribing area around each semiconductor chip forming area;
bonding the hole-free support substrate to the second surface of the support substrate having the holes with an adhesive layer melted by heating so as to block the holes;

bonding the main surface of the semiconductor wafer to the first surface of the support substrate having the holes with an adhesive layer melted by solvent;

thinning the back of the semiconductor wafer to a predetermined thickness by grinding and wet-etching;

selectively etching the back of the semiconductor wafer to define first trenches (separation trenches for division into pieces of semiconductor chips) which reach the metal layer formed in the scribing area, and second trenches (via holes) which reach the etching stopper layer;

forming a electrode layer on the whole range of the back of the semiconductor wafer to provide a PHS structure;

melting the adhesive layer by heating and sliding the support substrate having the holes with respect to the hole-free support substrate to thereby separate the support substrate having the holes therefrom;

supplying solvent from the second surface of the support substrate having the holes through the plurality of holes to thereby reduce adhesive power of the adhesive layer for bonding the support substrate and the semiconductor wafer to each other;

peeling a group of the semiconductor chips arranged in plate form, which are mutually connected by the electrode layer and the metal layer formed in the scribing area, from the support substrate having the holes;

bonding a support tape (ultraviolet-ray cured adhesion type resin tape) to the electrode layer forming surface of the semiconductor chip group arranged in plate form; and cutting the electrode layer and metal layer for connecting the respective semiconductor chips of the semiconductor chip group arranged in plate form to one another to thereby separate the respective semiconductor chips.

According to the present invention, a support substrate having holes or perforated support substrate, and a hole-free support substrate are separated from each other by heating and melting an adhesive layer provided therebetween and sliding the perforated support substrate with respect to the hole-free support substrate. Afterwards, an adhesive layer for bonding a semiconductor wafer and the perforated support substrate to each other is melted by solvent through the use of holes defined in the perforated support substrate. Therefore, the semiconductor wafer can be separated from the perforated support substrate in a time shorter than ever, and hence an improvement in productivity can be achieved.

Since the separation of the semiconductor wafer depends on the melting of the adhesive layer by the solvent, no load is placed on the semiconductor wafer, cracks and breaks become hard to occur, and hence an improvement in yields can be achieved.

Since separation trenches and via holes for bringing the semiconductor wafer into pieces of semiconductor chips are defined by etching after the thinning of the semiconductor wafer, and an electrode layer is formed on the back of the semiconductor wafer, a thinned PHS structure can easily be manufactured.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

Figure 1A:
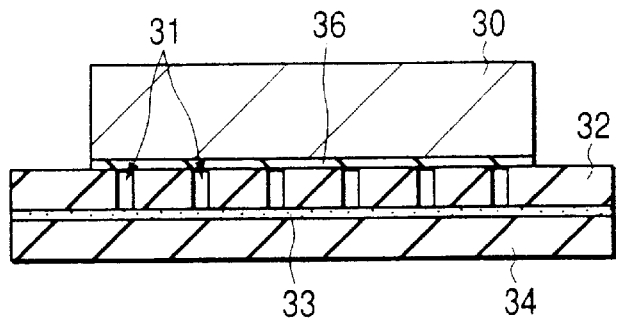
FIGS. 1(a) to 1(c) are typical diagrams showing a method of manufacturing a semiconductor device, according to one embodiment (first embodiment) of the present invention.

Preferred embodiments of the present invention will hereinafter be described in detail with reference to the accompanying drawings. Incidentally, elements of structure or components each having the same function in all the drawings for describing the embodiments of the present invention are identified by the same reference numerals and their repeated description will therefore be omitted.

First Embodiment

Figure 1B:
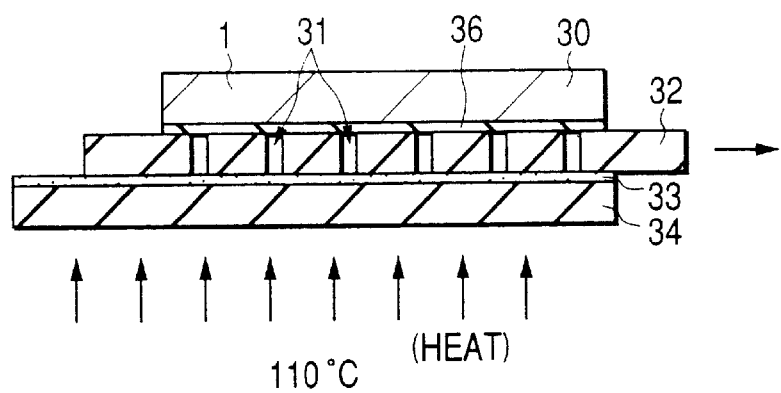
Figure 1C:
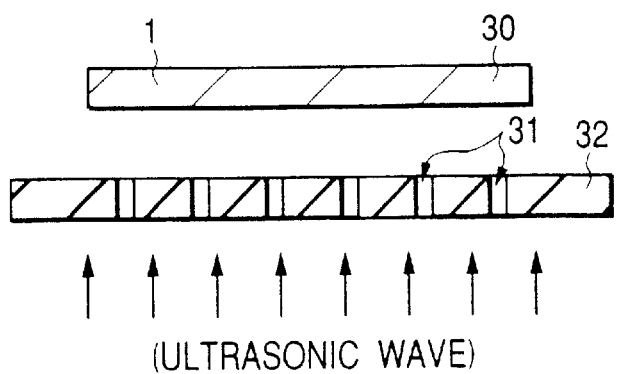
Figure 2:
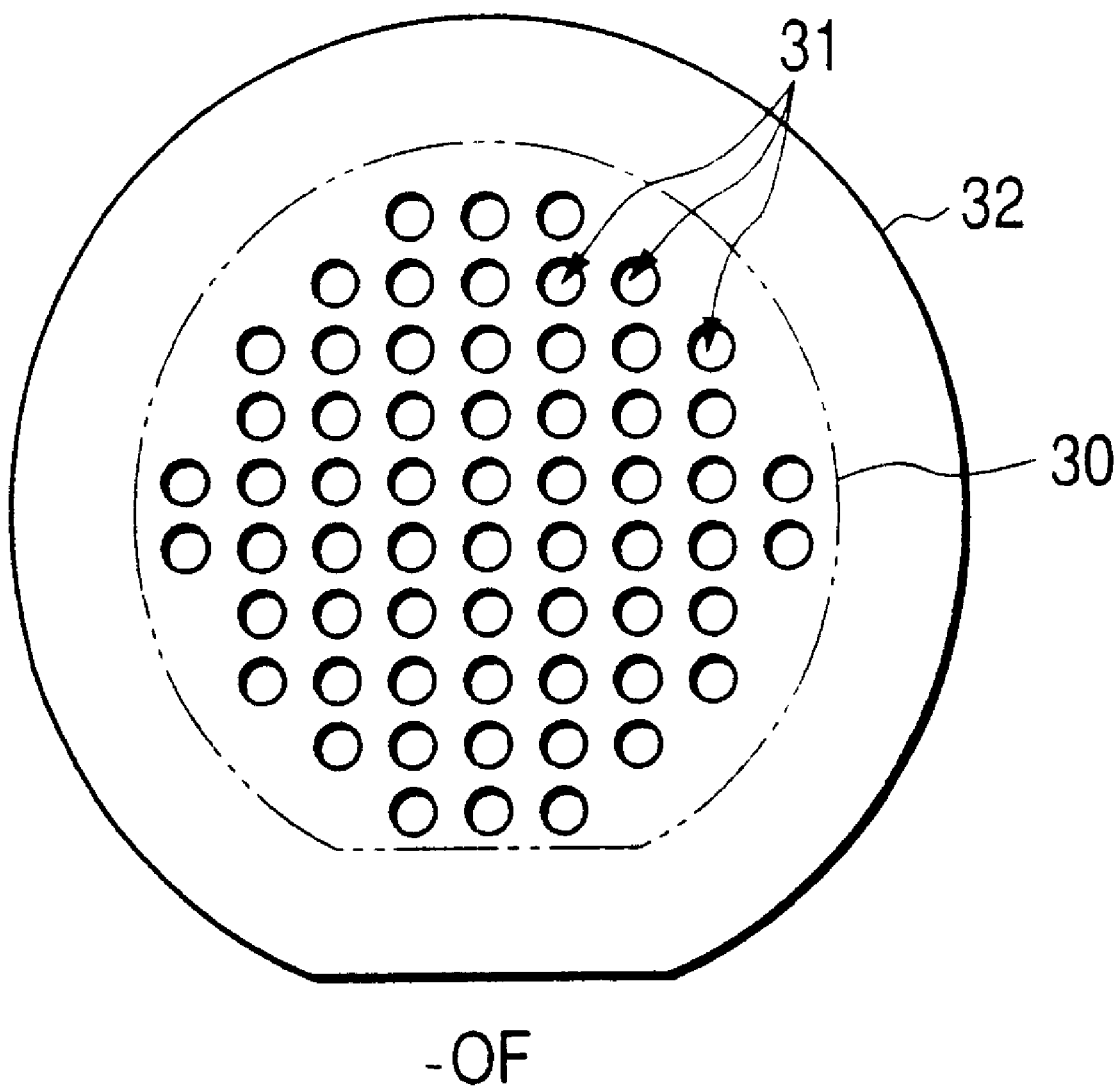
FIG. 2 is a typical diagram illustrating a perforated support substrate and a semiconductor wafer employed in the first embodiment.

FIGS. 1(a) through 1(c) and FIG. 2 are respectively diagrams related to a method of manufacturing a semiconductor device, according to one embodiment (first embodiment) of the present invention. FIGS. 1(a) through 1(c) are typical diagrams showing a thickness reduction in a semiconductor wafer and a method of separating the semiconductor wafer from a support substrate, and FIG. 2 is a typical diagram showing the semiconductor wafer applied onto a perforated support substrate, respectively.

As shown in FIG. 1(a), a semiconductor wafer 30 is first applied or bonded to a bilayer-structured support substrate. In the semiconductor wafer 30, although not illustrated in the drawing, scribing areas are provided so as to extend on the main surface side thereof in all directions. Semiconductor elements such as an HBT, etc. are formed in a rectangular area surrounded by the scribing areas. The main surface of the semiconductor wafer 30 is bonded to a first surface of a perforated support substrate 32 with or by an adhesive layer 36 interposed therebetween. The back opposite to the main surface of the semiconductor wafer 30 serves as a processing surface for a reduction in thickness thereof. The semiconductor wafer 30 has a thickness of 600 μm, for example.

As shown in FIG. 1(a), the bilayer-structured support substrate has a structure wherein a support substrate free of holes 31 (called "non-perforated or hole-free support substrate 34") and a support substrate with the holes 31 defined therein (called "perforated support substrate 32") are bonded to each other with an adhesive layer 33 interposed therebetween. The holes 31 are through holes which extend from a first surface of the perforated support substrate 32 to a second surface thereof corresponding to the back thereof opposite to the first surface. The second surface of the perforated support substrate 32 is bonded to a first surface of the hole-free support substrate 34 with the adhesive layer 33 interposed therebetween. A second surface of the hole-free support substrate 34, which is opposite to the first surface of the hole-free support substrate 34, serves as an exposed surface.

As shown in FIG. 2, the perforated support substrate 32 takes the shape of a circular disc whose part is linearly cut away. This linear portion serves as orientation flat (OF) indicative of an orientation. Further, the holes 31 are arranged in the perforated support substrate 32 so as not to exist in the edge of the semiconductor wafer 30 and outside it. Thus, one ends of the holes 31 are blocked by the hole-free support substrate 34, whereas the other ends thereof are blocked by the semiconductor wafer 30.

This is done to prevent the trouble that if the holes 31 exist in the edge of the semiconductor wafer 30 and in an area out of the semiconductor wafer 30 where plating or the like is done according to the semiconductor device manufacturing method, the adhesive layer 33 for applying the perforated support substrate 32 and the hole-free support substrate 34 to each other exists in the bottom of each hole 31, whereby the adhesive layer 33 is melted by a plating solution and a plating bath is contaminated, so that satisfactory plating formation cannot be carried out.

The perforated support substrate 32 and the hole-free support substrate 34 are identical in size to each other although their outer shapes are not limited in particular. Further, they are respectively formed of a material resistant to heat and excellent in resistance-to-chemicals, e.g., a glass plate such as quartz glass. The adhesive layer 33 for bonding the perforated support substrate 33 and the hole-free support substrate 34 to each other makes use of a material melted by heating, e.g., wax. The adhesive layer 36 for bonding the semiconductor wafer 30 to the first surface of the perforated support substrate 32 makes use of a material melted by a solvent, e.g., wax.

Since priority is given to flatness, liquid wax is used for these adhesive layers 33 and 36 and rotated at high speed by a spin coater to provide their flatnesses. As the wax, is used one which is 30 cps in viscosity at 25° C. and has a flow start temperature of about 72° C.

Next, the back of the semiconductor wafer 30 bonded to the bilayer-structured support substrate is removed by a predetermined thickness although not shown in the drawing to thereby achieve a reduction in the thickness of the wafer. Namely, the reverse side of the semiconductor wafer 30 is ground and wet-etched so that the thickness of the semiconductor wafer 30 reaches a predetermined thickness. For example, the thickness of the semiconductor wafer 30 is set to about 30 μm.

Next, the hole-free support substrate 34 is removed as shown in FIG. 1(b). In the present step, the adhesive layer 33 for bonding the hole-free support substrate 34 and the perforated support substrate 32 to each other is heated and melted. Further, the perforated support substrate 32 is slid (slid in the direction indicated by arrow) relative to the hole-free support substrate 34 to separate the perforated support substrate 32 form the hole-free support substrate 34. For example, the adhesive layer 33 is heated to about 110° C. and melted.

Since no external force acts on the semiconductor wafer 30, the semiconductor wafer 30 is not cracked or broken.

Further, since the present working is short-time slide working except for the time required to perform heating at a predetermined temperature, working time can be shortened.

Next, the perforated support substrate 32 is removed as shown in FIG. 1(c). In the present step, the adhesive layer 36 for bonding the semiconductor wafer 30 and the perforated support substrate 32 to each other is melted with a solvent to thereby separate the perforated support substrate 32 from the semiconductor wafer 30. For example, the perforated support substrate 32 with the semiconductor wafer 30 attached thereto is immersed in IPA (Isopropyl alcohol) to solve the adhesive layer 36. At this time, supersonic vibrations are applied to accelerate its dissolution. Since the solvent reaches the adhesive layer 36 through the respective holes 31 defined in the perforated support substrate 32, and the holes 31 are densely defined in their corresponding locations, the time required to separate the perforated support substrate 32 from the semiconductor wafer 30 is greatly shortened as compared with the conventional one. While the conventional method needed about one week in the case of a wafer having a diameter of 3 inches, for example, the separation time can be reduced to about 4 hours in the first embodiment.

According to the method of manufacturing the semiconductor device, according to the first embodiment, the following advantageous effects are brought about:

(1) When the semiconductor wafer 30 is separated from the bilayer-structured support substrate after the reduction in the thickness of the semiconductor wafer 30, the following is done as a first-stage job. Namely, the adhesive layer 33 for bonding the perforated support substrate 32 and the hole-free support substrate 34 to each other is melted by heating, and the perforated support substrate 32 free from the need for mutual care of the break and cracks between the perforated support substrate 32 and the hole-free support substrate 32 is slid relative to the hole-free support substrate 34 for their separation. Thereafter, the following is done as a second-stage job. Namely, the solvent is caused to pass through the holes 31 defined in the perforated support substrate 32 to melt and disappear or eliminate the adhesive layer 36 for bonding the semiconductor wafer 30 and the perforated support substrate 32 to each other. Thus, since no external force acts on the semiconductor wafer 30, the semiconductor wafer 30 is separated from the perforated support substrate 32. Accordingly, the semiconductor wafer 30 can be separated without developing cracks and breaks in the thinned semiconductor wafer 30, thus enhancing yields.

(2) Since the separation of the semiconductor wafer 30 from the support substrate is done using the holes defined in the perforated support substrate 32, such separation can be carried out in a short time as compared with the conventional one, and the manufacturing cost of the semiconductor device can be reduced.

(3) While the perforated support substrate 32 is used, the holes 31 defined in the perforated support substrate 32 are blocked by the semiconductor wafer 30 and the hole-free support substrate 34 in a process up to the separation of the semiconductor wafer 30. Therefore, the adhesive layer 36 for bonding the perforated support substrate 32 and the semiconductor wafer 30 to each other, and the adhesive layer 33 for bonding the perforated support substrate 32 and the hole-free support substrate 34 to each other are melted without contact with the plating solution or the like used in processing and hence the adhesive is diffused into the solution. The exposed surface of the semiconductor wafer 30 is prevented from being subjected to damage and contaminated by the adhesive. Accordingly, a semiconductor device excellent in quality can be manufactured.

Second Embodiment

FIGS. 3 through 16 are respectively diagrams related to a method of manufacturing a semiconductor device, according to another embodiment (second embodiment) of the present invention.

Figure 3:
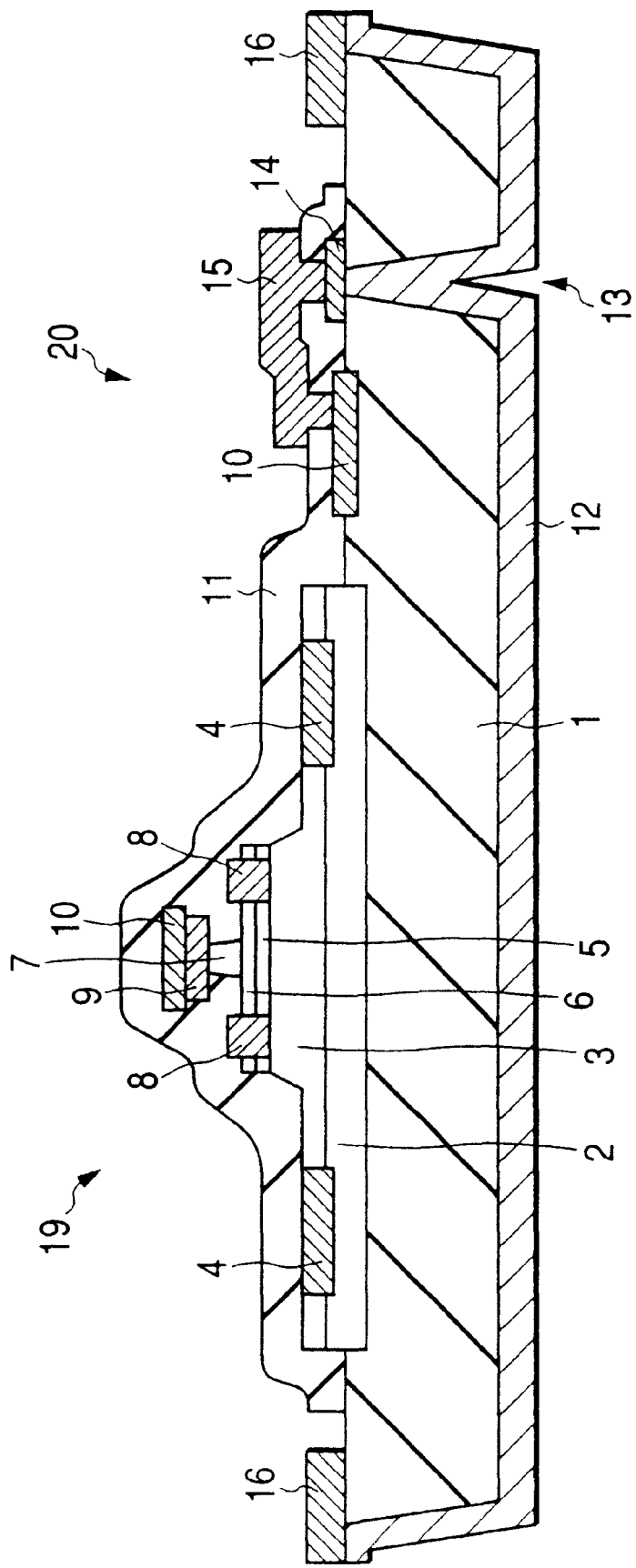
FIG. 3 is a cross-sectional view of a semiconductor chip manufactured by a method of manufacturing a semiconductor device, according to another embodiment (second embodiment) of the present invention.
Figure 4:
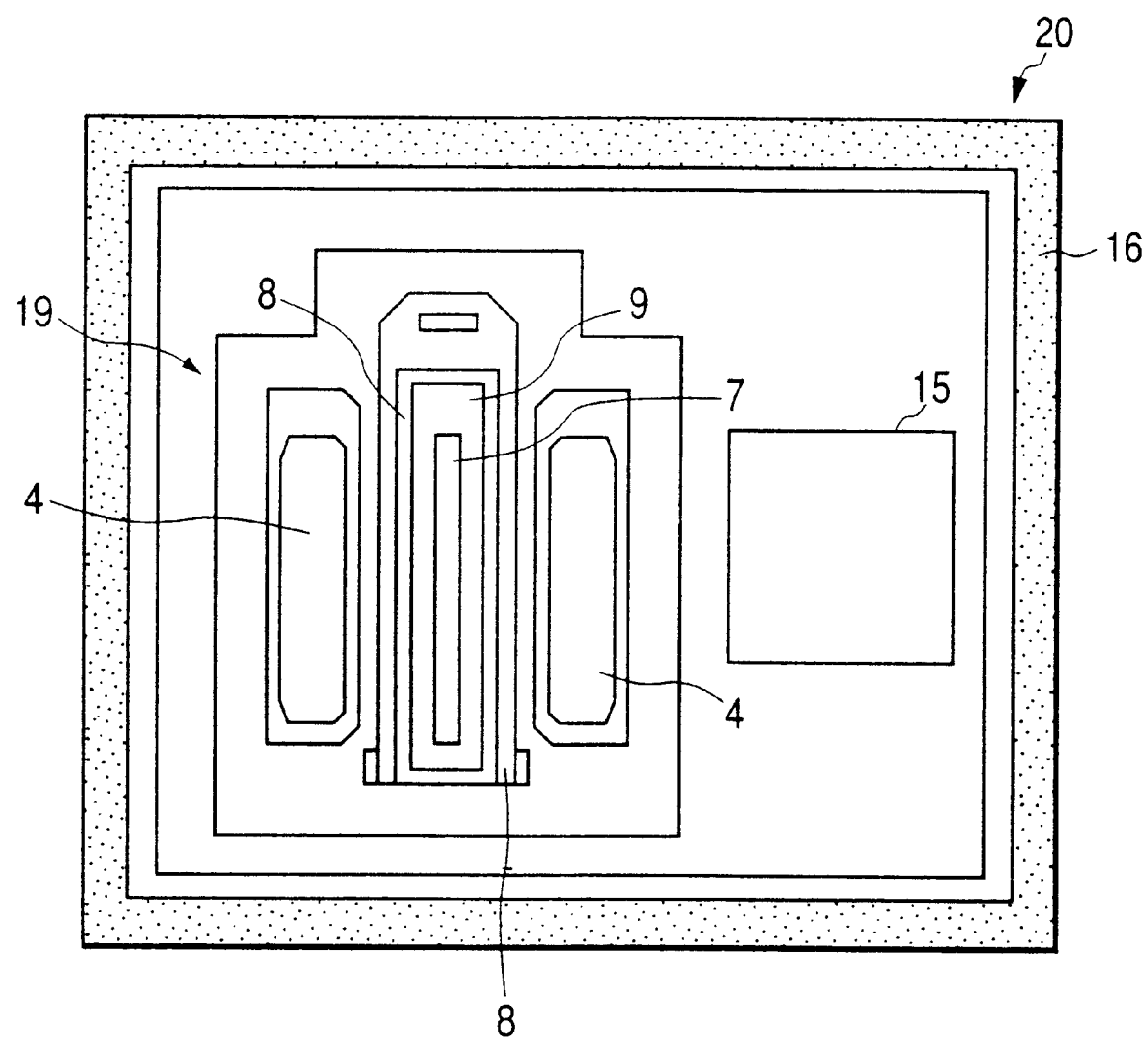
FIG. 4 is a typical plan view of the semiconductor chip.
Figure 5:
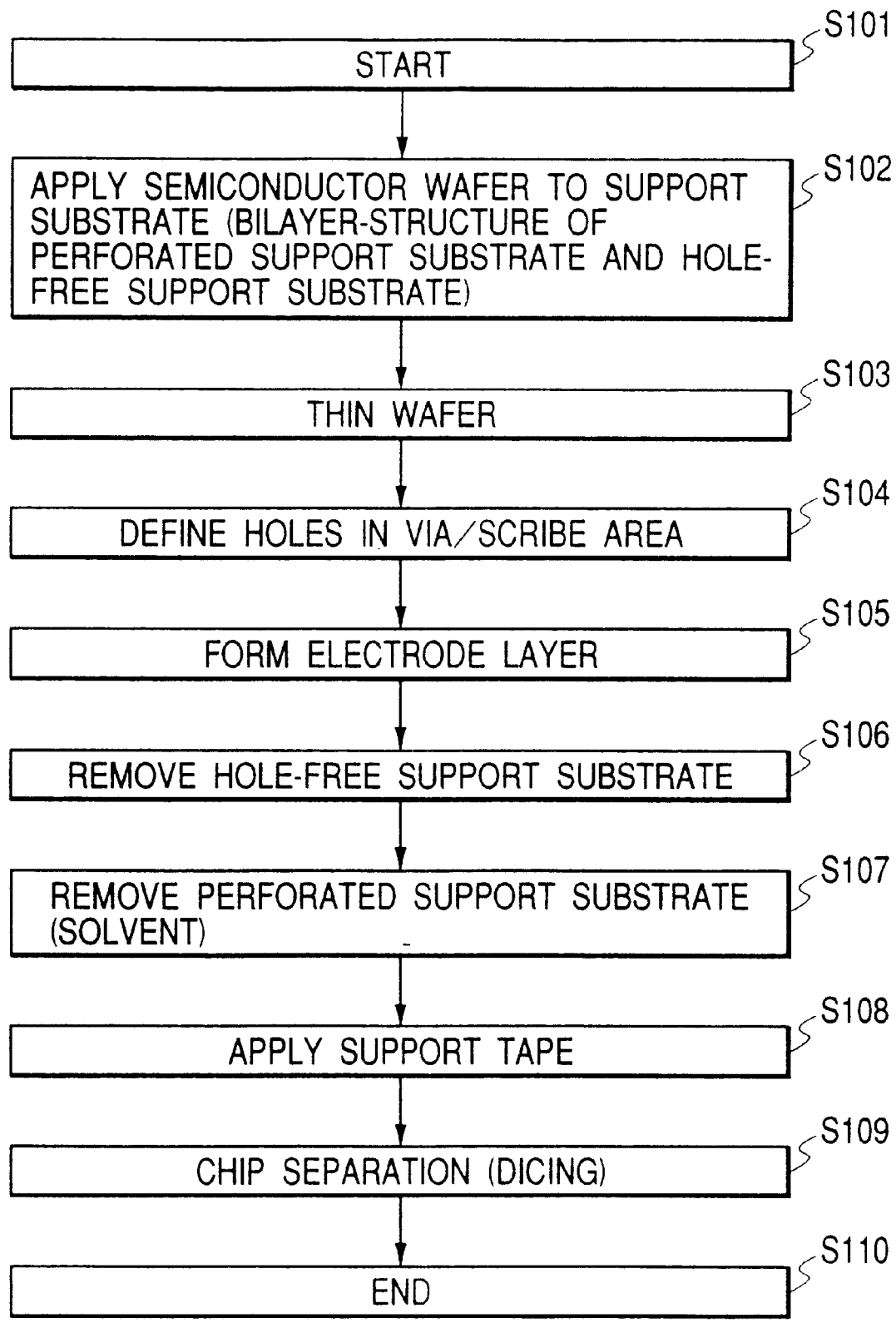
FIG. 5 is a flowchart for describing the method of manufacturing the semiconductor device, according to the second embodiment.

In the present embodiment, an example in which the present invention is applied to the technology of manufacturing an HBT, will be explained. The HBT manufactured by the manufacturing method according to the second embodiment will now be described with reference to FIGS. 3 and 4. FIG. 3 is a cross-sectional view of an HBT semiconductor chip, and FIG. 4 is a typical plan view showing respective semiconductor regions (emitter, base and collector) and partial electrodes of the HBT semiconductor chip, respectively.

A semiconductor chip 20 with the HBT formed therein is formed on the basis of a semi-insulating GaAs substrate 1 as shown in FIG. 3. Namely, an $n^+$ type GaAs sub-collector layer 2 and an n type GaAs collector layer 3 formed on the $n^+$ type GaAs sub-collector layer 2 are selectively provided on a main surface of the semi-insulating GaAs substrate 1. Further, the n type GaAs collector layer 3 has a peripheral portion etched to a depth at a midpoint in the same layer, and a central portion formed as an protruded mesa portion. In an area in which the thin n type GaAs collector layer 3 away from the mesa portion is formed, the n type GaAs collector layer 3 is partly removed by etching, and collector electrodes 4 are respectively formed at the removed portions.

A $p^+$ type GaAs base layer 5, an n type InGaP emitter layer 6, and an $n^+$ type GaAs cap layer 7 are successively provided on the mesa portion so as to overlap each other. The $p^+$ type GaAs base layer 5 and the n type InGaP emitter layer 6 are coincidentally superimposed on each other with substantially the same size. However, the $n^+$ type GaAs cap layer 7 is formed in the center of the mesa portion in the form of a slender rectangle.

In a mesa area out of the $n^+$ type GaAs cap layer 7, the n type InGaP emitter layer 6 and the $p^+$ type GaAs base layer 5 are selectively removed by etching to form contact holes. Base electrodes 8 are provided in their corresponding contact holes.

Further, an emitter electrode 9 is formed on the upper surface of the $n^+$ type GaAs cap layer 7. An emitter wiring layer 10 is formed on the emitter electrode 9. Some of the emitter wiring layer 10 extends even to the surface of the semi-insulating GaAs substrate 1 away from the $n^+$ type GaAs sub collector layer 2 and the n type GaAs collector layer 3.

The respective portions on the main surface side of the semi-insulating GaAs substrate 1 are covered with an insulating film 11 to achieve device or element protection. While the insulating film 11 is represented as a single layer in the drawing, it is actually represented as a plurality of layers, and their patterns are different from each other in the respective layers.

Since the HBT fabricated in the second embodiment is used as a PHS, an electrode layer 12 is formed on the back side of the semi-insulating GaAs substrate 1 over its overall area. In order to electrically connect the electrode layer 12 and the emitter wiring layer 10 placed over the semi-insulating GaAs substrate 1, a second trench (via hole) 13 is defined over the range of the main surface of the semi-insulating GaAs substrate 1 to the back thereof. An end on the main surface side of the semi-insulating GaAs substrate 1, of the via hole 13 is blocked by its corresponding etching stopper layer 14 formed of a conductor. The etching stopper layer 14 is provided on the main surface side of the semi-insulating GaAs substrate 1 before the via hole 13 is defined. The etching stopper layer 14 and the emitter wiring layer 10 are electrically connected to each other by a wiring layer 15 extending over the insulating film 11.

The electrode layer 12 has a structure which cover even the peripheral surface of the semiconductor chip 20. A tip or leading portion thereof is superimposed on a metal layer 16 (see FIG. 4) provided on the main surface of the semi-insulating GaAs substrate 1. In a state of the semiconductor wafer prior to the formation of the semiconductor chip 20, the metal layer 16, which serves as the etching stopper layer, is formed so as to overlap with its corresponding scribing area (also called dicing area) on the main surface of the semiconductor wafer. Upon etching of each scribing area on the back side of the semiconductor wafer brought into semiconductor chip form, etching is done so as to reach the metal layer 16. Finally, the metal layer 16 and the electrode layer 12 superimposed on the metal layer 16 are cut off along the scribing area to thereby form each semiconductor chip.

Incidentally, the scribing area has a predetermined width and is provided on the main surface of the semiconductor wafer in lattice form. For example, the scribing area is cut by dicing. In the second embodiment, the metal layer 16 and the electrode layer 12 are formed of gold. Since, at this time, gold is excellent in malleability upon the dicing, projections 12 called burrs are apt to occur in their cut-off ends (see FIG. 16).

Thus, when the semiconductor chip 20 is fixed to a mounted board or substrate 22 with the adhesive layer interposed therebetween to thereby a semiconductor device (electronic equipment), gaps or the like occur in their bonded portion due to projections if the adhesive layer is thin. Thus, it is not possible to allow heat generated in the semiconductor chip to effectively escape to the mounted substrate. A reduction in the life of the HBT and a reduction in reliability occur.

Figure 16:
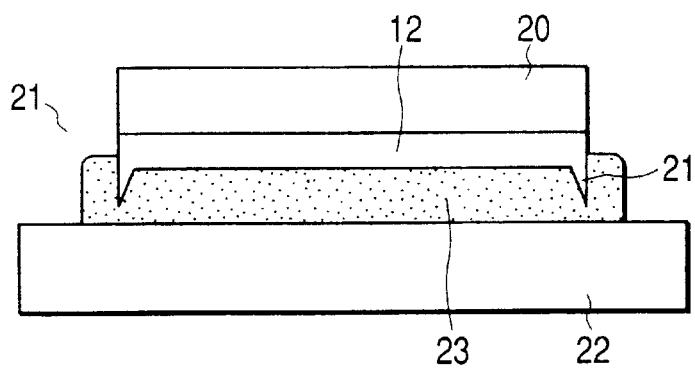
FIG. 16 is a typical cross-sectional view showing the semiconductor chip fixed with a thick adhesive in the high-frequency power amplifying module.

Therefore, the following is carried out in the second embodiment. While it is one of the characteristics of the present invention, a semiconductor chip 20 is fixed to its corresponding mounted substrate 22 with an adhesive layer 23 thicker than a produced projection 21 longest in length as shown in FIG. 16. Since the adhesive layer 23 effectively transfers heat generated in the semiconductor chip 20 to the mounted substrate 22, it makes use of an adhesive material having high thermal conductivity.

The method of manufacturing the semiconductor chip 20 will next be explained. In the method of manufacturing the semiconductor device, work is started [Step 101 (S101)] as shown in a flowchart of FIG. 5. Thereafter, a semiconductor wafer is bonded to a support substrate [corresponding to a bilayer-structured support substrate comprised of perforated support substrate and hole-free support substrate] (S102), the semiconductor wafer is thinned (S103), holes are defined in a via/scribing area (S104), an electrode layer is formed (S105), the hole-free support substrate is removed by heating and melting (S106), a solvent is melted to remove the perforated support substrate (S107), a support tape is applied or bonded to the wafer (S108), and chip separation using dicing is carried out (S109). The present work is finished through these (S110).

The method will be described below in accordance with the respective steps and with reference to the respective drawings. Incidentally, for convenience of description, the method will be explained in a state in which only two HBT (semiconductor elements) are drawn as viewed in a cross section of the semiconductor wafer.

Figure 6:
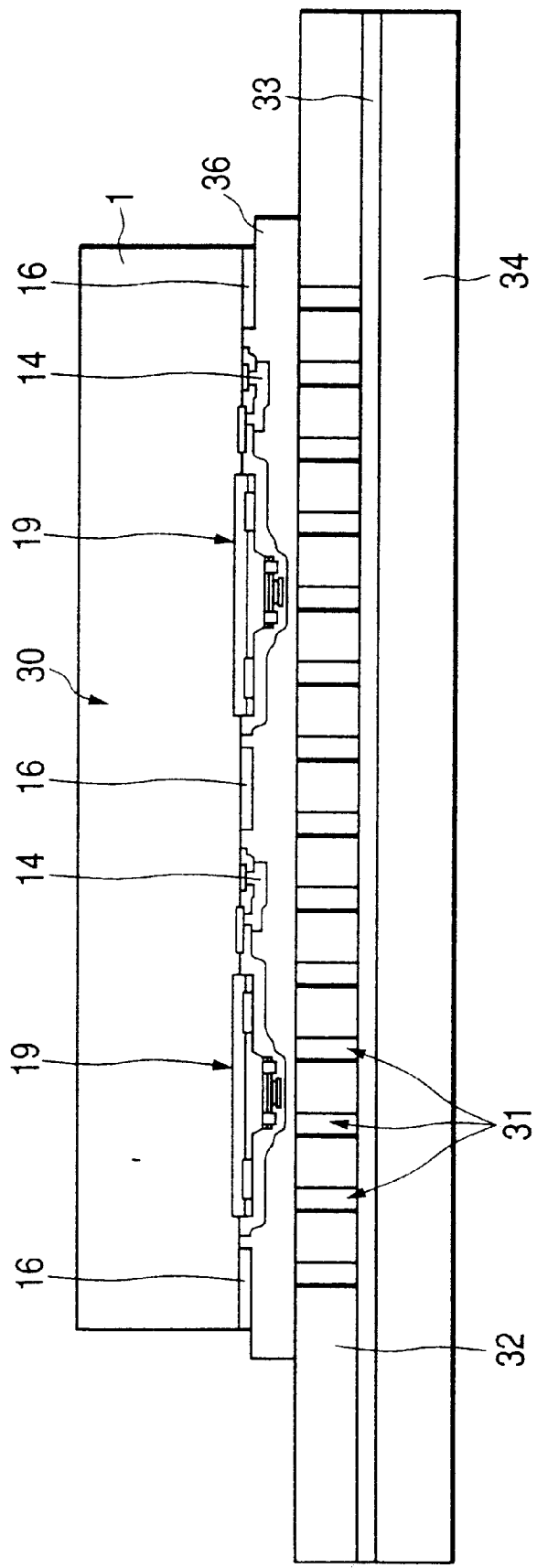
FIG. 6 is an enlarged cross-sectional view of the bilayer-structured support substrate and a wafer attached to the substrate.

As shown in FIG. 6, a support substrate 32 having a plurality of holes 31 (perforated support substrate) is first laminated with a support substrate free of holes (hole-free support substrate) 34 with an adhesive layer 33 interposed therebetween. Further, a semiconductor wafer (wafer) 30 is bonded or applied to one surface (first surface) of the perforated support substrate 32 with an adhesive layer 36 interposed therebetween (S102).

The semiconductor wafer 30 is provided with scribing areas so as to extend on the main surface side thereof in all directions. The aforementioned HBT (semiconductor elements) 19 are formed in a rectangular area surrounded by the scribing areas. The main surface of the semiconductor wafer 30 is bonded to the first surface of the perforated support substrate 32 with the adhesive layer 36 interposed therebetween.

In this state, however, the exposed back of the semiconductor wafer (semi-insulating GaAs substrate 1) is not processed, and no via holes and electrode layer are formed. Thus, the back of the semi-insulating GaAs substrate 1 is kept flat. Further, the thickness of the semiconductor wafer 30 is set to about 600 $\mu$m, for example. As shown in FIG. 6, a metal layer 16 used as an etching stopper layer is provided at a portion corresponding to the scribing area on the main surface side in a subsequent process. An etching stopper layer 14 is provided so as to correspond to each via hole forming portion. Finally, the semiconductor wafer 30 is diced along the center of the scribing area so as to be brought into a plurality of semiconductor chips. Thus, the area prior to being separated by dicing becomes a semiconductor chip forming area.

The holes 31 are through holes which extend from the first surface of the perforated support substrate 32 to a second surface thereof corresponding to the back thereof opposite to the first surface. The second surface of the perforated support substrate 32 is bonded to a first surface of the hole-free support substrate 34 with the adhesive layer 33 interposed therebetween. The first surface of the hole-free support substrate 34 serves as an exposed surface. Owing to the bonding of the two, a bilayer-structured support substrate is formed.

In a manner similar to the first embodiment, the perforated support substrate 32 comprises a disc having orientation flat at its part. Further, the holes 31 are arranged in the perforated support substrate 32 so as not to exist in the edge of the semiconductor wafer 30 and outside it (see FIG. 2). This results in that if the holes 31 exist in the edge of the semiconductor wafer 30 and in an area out of the semiconductor wafer 30 upon the formation of the electrode layer by plating to be done in a subsequent process, the adhesive layer 33 for bonding the perforated support substrate 32 and the hole-free support substrate 34 to each other exists in the bottom of each hole 31, whereby the adhesive layer 33 is dissolved or melted by a plating solution, thus interfering with satisfactory plating formation. One ends of the holes 31 are blocked by the hole-free support substrate 34, whereas the other ends thereof are blocked by the semiconductor wafer 30.

No particular restrictions are imposed on outside dimensions of the perforated support substrate 32 and the hole-free support substrate 34. Further, the perforated support substrate 32 and the hole-free support substrate 34 are respectively formed of a material resistant to heat and excellent in resistance-to-chemicals, e.g., a glass plate such as quartz glass. The adhesive layer 33 for applying the perforated support substrate 32 and the hole-free support substrate 34 to each other makes use of a material melted by heating, e.g., wax. The adhesive layer 36 for bonding the semiconductor wafer 30 to the first surface of the perforated support substrate 32 makes use of a material melted by solvent, e.g., wax.

Since priority is given to flatness, liquid wax is used for these adhesive layers 33 and 36 and rotated at high speed by a spin coater to provide their flatnesses. As the wax, is used one which is 30 cps in viscosity at 25° C. and has a flow start temperature of about 72° C.

Figure 7:
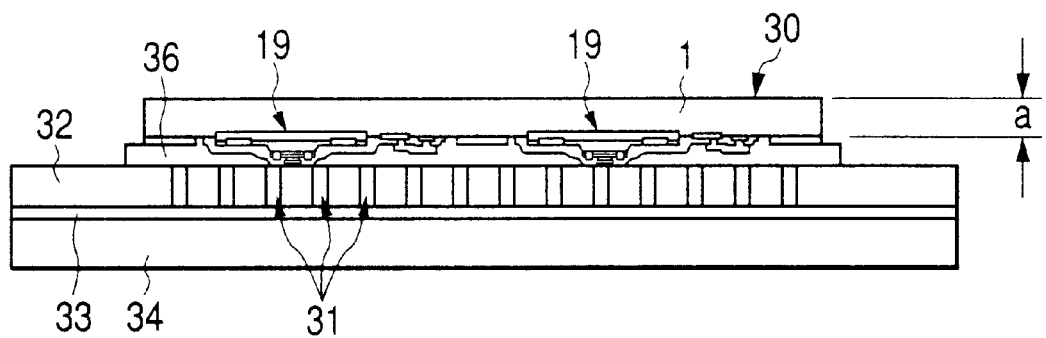
FIG. 7 is a cross-sectional view showing a wafer and a substrate thin-layered in the manufacturing method according to the first embodiment.

Next, as shown in FIG. 7, the back of the semiconductor wafer 30 is removed by a predetermined thickness. Namely, the reverse side of the semiconductor wafer 30 is ground and wet-etched so that the thickness of the semi-insulating GaAs substrate 1 reaches a predetermined thickness a (S103). For example, the thickness a thereof is set to about 30 μm. The above grinding is done using a grinding stone of #2000, for example, until the semi-insulating GaAs substrate 1 reaches 80 μm. Afterwards, the semi-insulating GaAs substrate 1 is etched to reach a thickness of 30 μm by wet etching with a mixture of, for example, $H_2SO_4$, $H_2O_2$ and $H_2O$ as an etchant.

Figure 8:
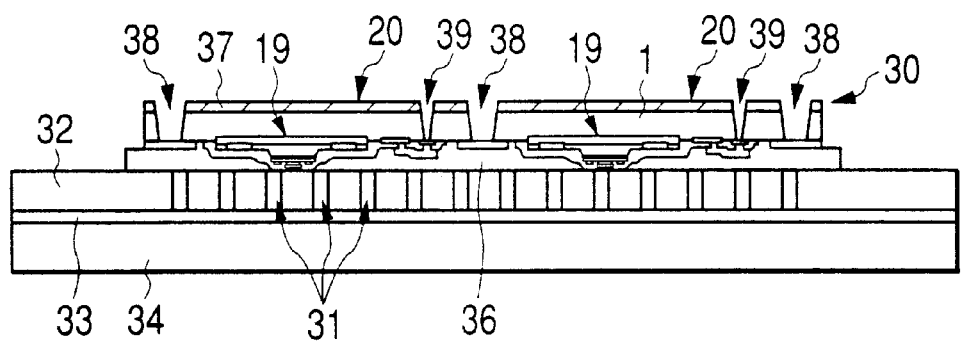
FIG. 8 is a cross-sectional view showing a wafer in which etching is done from the back of the wafer to separate chip forming areas from one another, whereby a plurality of semiconductor chips are formed therein, and via holes are defined in the respective semiconductor chips, and a support substrate both employed in the manufacturing method according to the first embodiment.

Next, an etching mask 37 is formed on the back of the semiconductor wafer 30 (semi-insulating GaAs substrate 1) as shown in FIG. 8. Thereafter, the semi-insulating GaAs substrate 1 is selectively etched by etching to thereby form separation trenches (first trenches) 38 and via holes (second trenches) 39. The etching mask 37 has such a shape as to expose an area corresponding to each scribing area and part (via hole forming area) of each semiconductor chip forming area.

The etching is done according to, for example, two-stage etching of wet etching and dry etching. The wet etching is done using the etchant based on the mixture of, for example, $H_2SO_4$, $H_2O_2$ and $H_2O$. Holes defined by the etching are caused to reach the metal layer 16 provided in the scribing area and the etching stopper layer 14 provided in the via hole forming area. Afterwards, the dry etching is done using a mixed gas of $Cl_2$ and $SiCl_4$, for example, to ensure hole dimensions.

The semiconductor wafer 30 is separated every semiconductor chip forming areas by the etching of the scribing area. Thus, the semiconductor wafer 30 is substantially divided into a plurality of semiconductor chips 20. After the completion of the etching, the etching mask 37 is removed.

Figure 9:
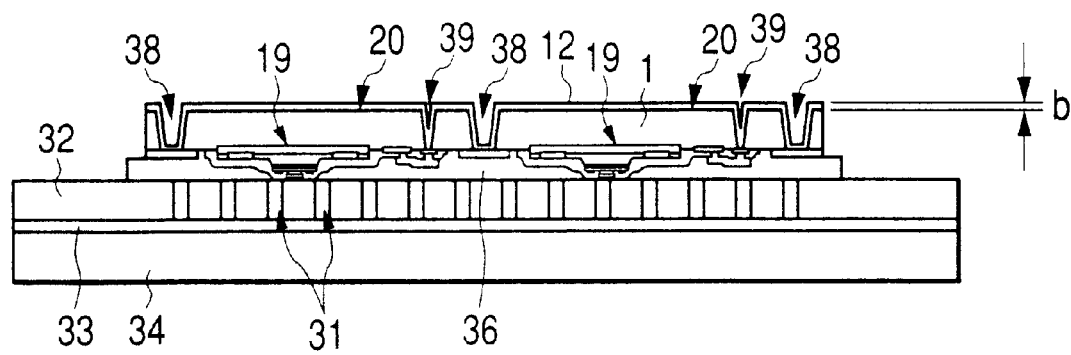
FIG. 9 is a cross-sectional view showing the state in which a metal layer is formed over the whole area on the first surface side, of the support substrate on which the semiconductor chips exist, in the manufacturing method according to the first embodiment.

Next, an electrode layer 12 is formed over the entire range of the back of the semi-insulating GaAs substrate 1 as shown in FIG. 9 (S105). The electrode layer 12 is formed by a sputtering method, e.g., by forming a species electrode (underelectrode) comprised of, for example, Pt, Ti, Pt and Au and thereafter plating Au on the species electrode. The thickness b of the electrode layer 12 formed by the species electrode and the plated layer is about 15 μm, for example. It is of importance that Au is reliably applied within the via holes 39 upon this plating. The electrode layer 12 extending on the back side of each semiconductor chip 20, and the emitter electrode of each HBT (semiconductor element) 19 are electrically connected to each other by the electrode layer 12 lying within each via hole 39 to provide a PHS structure. Further, the metal layer 16 and the electrode layer 12 overlap each other in the scribing area. Thus, even if the hole-free support substrate 34 is removed from the respective semiconductor chips 20, the respective semiconductor chips 20 become integral with the metal layer 16 and the electrode layer 12 to thereby make a single semiconductor chip group.

Figure 10:
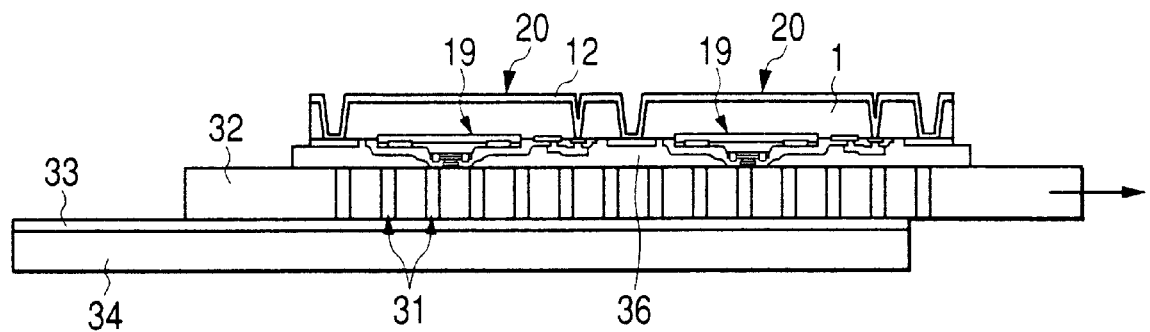
FIG. 10 is a cross-sectional view illustrating the state in which the perforated support substrate is separated from the hole-free support substrate in the manufacturing method according to the first embodiment.

Next, the hole-free support substrate 34 is removed as shown in FIG. 10 (S106). In the present step, a second surface of the hole-free support substrate 34 is placed on an unillustrated table heated to a predetermined temperature to melt the adhesive layer 33 for bonding the hole-free support substrate 34 and the perforated support substrate 32 to each other and thereby slide the perforated support substrate 32 (slide it in the direction indicated by arrow) with respect to the hole-free support substrate 34, thus separating the perforated support substrate 32 from the hole-free support substrate 34. For example, the hole-free support substrate 34 is placed on an iron plate heated to 110° C. to melt the adhesive layer 33.

Figure 11:
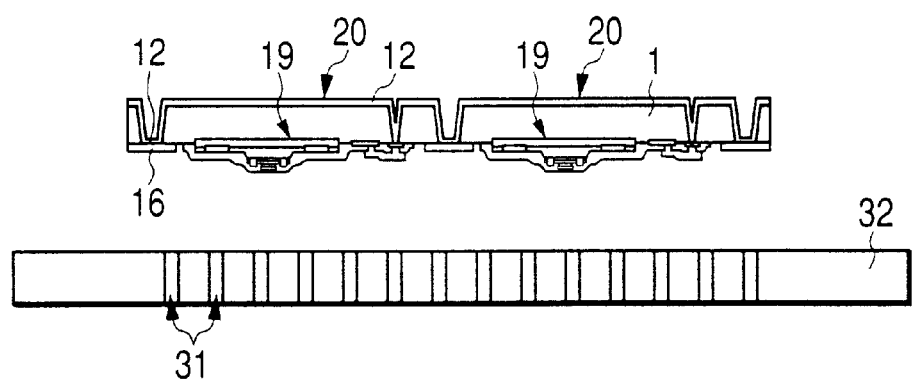
FIG. 11 is a cross-sectional view showing the state in which the perforated support substrate and a semiconductor chip group brought into integral form by the metal layer are separated from each other in the manufacturing method according to the first embodiment.

Next, as shown in FIG. 11, the perforated support substrate 32 is removed (S107). In the present step, the adhesive layer 36 for bonding the semiconductor chip 20 and the perforated support substrate 32 to each other is melted by solvent to thereby separate the perforated support substrate 32 form the semiconductor chip 20. For example, the perforated support substrate 32 with the semiconductor wafer 30 attached thereto is immersed in IPA (Isopropyl alcohol) to solve the adhesive layer 36. At this time, ultrasonic vibrations are applied to accelerate its dissolution. Since the solvent reaches the adhesive layer 36 through the respective holes 31 defined in the perforated support substrate 32, and the holes 31 are densely defined in their corresponding locations, the time required to separate the perforated support substrate 32 from the semiconductor wafer 30 is greatly shortened as compared with the conventional one. While the conventional method needed about one week in the case of a wafer having a diameter of 3 inches, for example, the separation time can be reduced to about 4 hours in the second embodiment.

Figure 12:
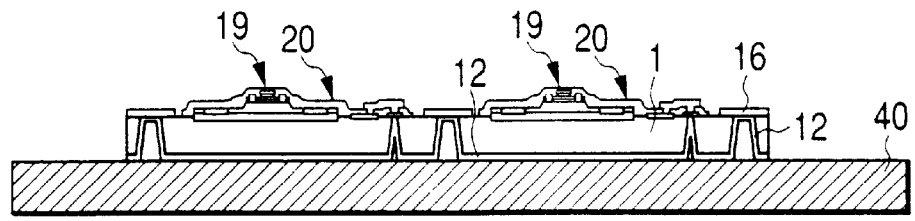
FIG. 12 is a cross-sectional view depicting the state in which the semiconductor chip group brought into integral form by the metal layer is attached to a support tape in the manufacturing method according to the first embodiment.

Next, as shown in FIG. 12, a support tape 40 is attached to the back (electrode layer 12) of each semiconductor chip 20 (S108). As the support tape 40, a normally-used dicing tape applied to the wafer upon dicing to support the wafer is used. For example, adhesion type resin tape cured in response to ultraviolet rays is used for the support tape 40. At this time, one uncured after the application of ultraviolet rays to the resin tape is used as paste for the ultraviolet-ray cured adhesion type resin tape. This is used to prevent paste from being put on Au-based burrs (projections 21) developed upon dicing in a subsequent process.

Figure 13:
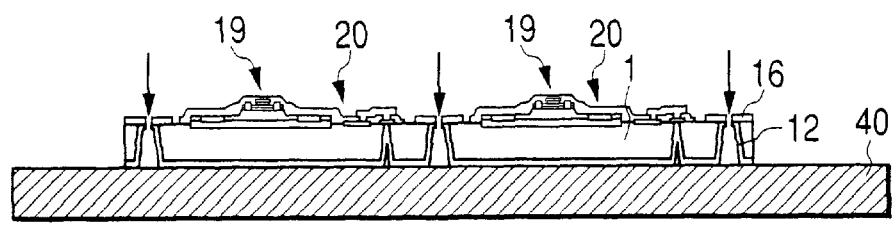
FIG. 13 is a cross-sectional view showing the state in which the metal layer lying between the semiconductor chips on the support tape is cut off to provide chip separation in the manufacturing method according to the first embodiment.
Figure 14:
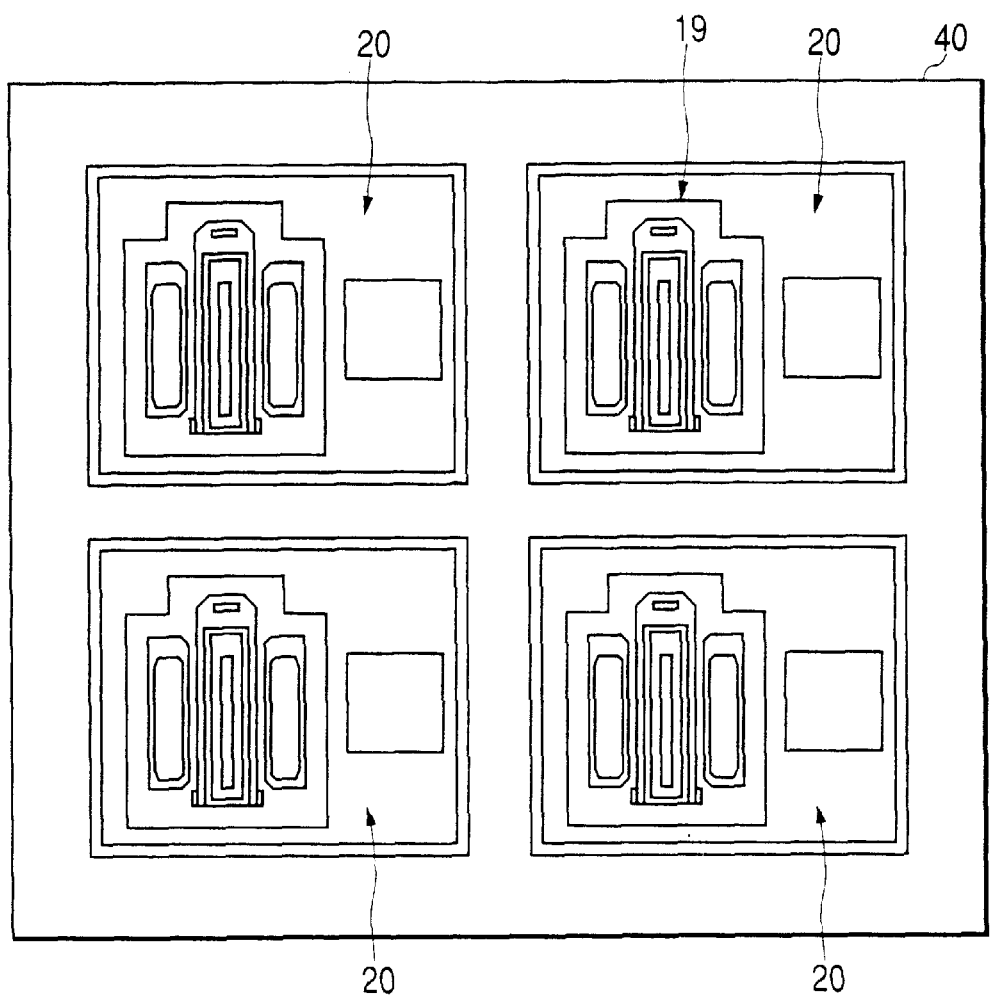
FIG. 14 is a typical plan view illustrating the semiconductor chips on the support tape.

Next, as shown in FIG. 13, the metal layer 16 and the electrode layer 12 superimposed thereon are cut by dicing along the center of each scribing area (cut points are indicated by arrows) to provide chip separation (S109). Namely, since the metal layer 16 and the electrode layer 12 having connected the respective semiconductor chips 20 are cut away, the semiconductor chips 20 are separated for every semiconductor chips 20. FIG. 14 is a plan view showing the four semiconductor chips 20 separated on the support tape 40.

Since gold is excellent in malleability as described above upon the dicing, projections 12 called burrs are apt to occur long in their cut-off ends (see FIG. 16). However, since the paste of the ultraviolet-ray cured adhesion type resin tape makes use of one uncured after the application of the ultraviolet rays, the projections 21 are prevented from sticking to the paste. After the completion of a chip separating process, the work is ended (S110).

Thereafter, the respective semiconductor chips 20 kept in a state of being attached to the support tape 40 are vacuum-absorbed and held by a normally-used vacuum absorption type pickup tool upon assembly of a semiconductor device such as a high-frequency power amplifying module. Thus, the semiconductor chips 20 are peeled off from the support tape 40 and chip-bonded to a mounted substrate.

Figure 15:
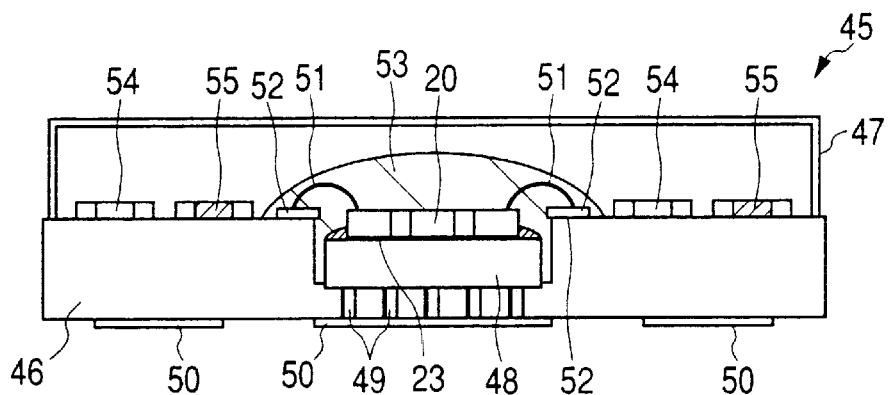
FIG. 15 is a typical cross-sectional view of a high-frequency power amplifying module in which the semiconductor chips manufactured by the manufacturing method according to the first embodiment are built.

A high-frequency power amplifying module in which the semiconductor chips 20 are built, will now be described in brief. FIG. 15 is a typical cross-sectional view of a high-frequency power amplifying module 45.

The high-frequency power amplifying module 45 has a module substrate (mounted or printed circuit board) 46 made up of a multilayer interconnection board, and a cap 47 for covering the main surface of the module substrate 46, and takes a rectangular structure flat as seen in appearance. A plurality of semiconductor chips 20 with HBT employed in the first embodiment incorporated therein are mounted in the module substrate 46. The respective transistors are successively cascade-connected to form amplifiers provided in a multistage configuration. Each of the semiconductor chips 20 is connected to a thermal diffusion plate 48 formed of a metal plate satisfactory in thermal conductivity at a hollow bottom provided in the main surface of the module substrate 46 by or with an adhesive layer 23 having high thermal conductivity. Since there may be cases in which the projections 21 are formed on the back side of each semiconductor chip 20 as described above, the adhesive layer 23 is formed so as to become thicker than the maximum one of protruded lengths of the projections 21. Further, the adhesive layer 23 causes even the tips or leading ends of the projections 21 to be reliably placed therewithin and prevents an adhesive failure developed due to the projections 21. The adhesive layer 23 is formed of silver paste, for example.

Further, thermal vias 49 each charged with a metal satisfactory in thermal conductivity are formed at the hollow bottom in large numbers. The thermal vias 49 are connected to one of conductors 50 provided on the back of the module substrate 46. The conductors 50 are provided on the back of the module substrate 46 as appropriate and form surface-mounted external terminals respectively. Although not illustrated in particular, the external terminals constitute an input terminal, an output terminal, a control terminal (bias supply terminal), a first voltage terminal supplied with a source voltage, and a second voltage terminal used as ground.

Other ends of conductive wirings 51 whose one ends are connected to their corresponding wirings 52 provided on the main surface of the module substrate 46, are connected to respective electrodes provided on the main surface of the semiconductor chip 20. A semiconductor chip 20 section including the wirings 51 is covered with an insulating resin 53 for the purpose of improving resistance to moisture.

Chip resistors 54 and chip capacitors 55, which constitute a bias circuit, an impedance matching circuit, etc. are mounted on the main surface of the module substrate 46. Electrodes of these chip parts are respectively connected to unillustrated wirings.

In the high-frequency power amplifying module 45, heat generated in each semiconductor chip 20 is successively transferred to the adhesive layer 23, the thermal diffusion plate 48, the thermal vias 49 and the conductor 50 and allowed to efficiently escape to a wiring board with the high-frequency power amplifying module 45 placed thereon. It is therefore possible to increase the life of the HBT and enhance the reliability thereof.

Such a high-frequency power amplifying module 45 inputs or receives input power from an input terminal and outputs amplified output power from an output terminal although its circuit configuration is not shown. Further, a control voltage supplied to a control terminal is supplied to transistors provided in respective stages through a gate bias circuit to control an output voltage.

According to the method of manufacturing the semiconductor device, according to the second embodiment, the following advantageous effects are brought about.

(1) The semiconductor wafer 30 is thinned and brought into semiconductor chip form. Afterwards, the electrode layer 12 for providing the PHS structure is formed, and the semiconductor chips separated by the metal layer 16 used as the portion corresponding to the scribing area superimposed on the electrode layer 12 are formed as the single semiconductor chip group. In this condition, the single semiconductor chip group can be separated from the bilayer-structured support substrate by using the method similar to the first embodiment. It is therefore possible to prevent damage to the respective semiconductor chips. As a result, manufacturing yields can be enhanced and a reduction in the manufacturing cost of the semiconductor device can be achieved.

(2) Since the adhesive layer 36 is melted by the solvent through the use of the holes defined in the perforated support substrate 32 to separate the single semiconductor chip group from the perforated support substrate 32, they can be separated from each other in a time shorter than ever, and the manufacturing cost of the semiconductor device can be reduced.

(3) While the perforated support substrate 32 is used, the holes 31 of the perforated support substrate 32 are blocked by the semiconductor wafer 30 and the hole-free support substrate 34 in the process up to the separation of the semiconductor wafer 30. Therefore, the adhesive layer 36 for bonding the perforated support substrate 32 and the semiconductor wafer 30 to each other, and the adhesive layer 33 for bonding the perforated support substrate 32 and the hole-free support substrate 34 to each other are melted without contacting the plating solution or the like used in processing and hence the adhesive is diffused into the solution. The exposed surface of the semiconductor wafer 30 is prevented from being subjected to damage and contaminated by the adhesive. Accordingly, a semiconductor device excellent in quality can be manufactured.

(4) Since the method of manufacturing the semiconductor device adopts a technique for connecting and holding up the divided plural semiconductor chips through the use of the electrode layer 12 of the PHS structure to form the single semiconductor chip group, applying the single semiconductor chip group to the support tape 40 after the separation of it from the support substrate, and cutting the electrode layer 12 and the metal layer 16 for connecting the respective semiconductor chips in the state in which the single semiconductor chip group is being bonded to the support tape 40 to thereby bring the single semiconductor chip group into the semiconductor chips 20, productivity is improved.

Third Embodiment

Figure 17:
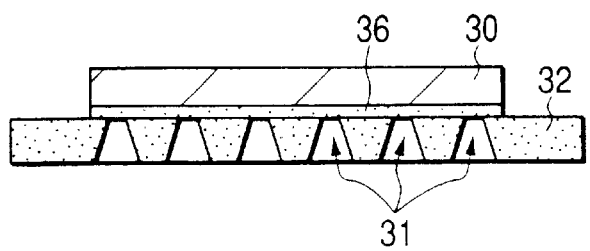
FIG. 17 is a typical diagram showing part of a method of manufacturing a semiconductor device according to a further embodiment (third embodiment) of the present invention.

FIG. 17 is a typical diagram showing part of a method of manufacturing a semiconductor device, according to a further embodiment (third embodiment) of the present invention. As shown in FIG. 17, holes 31 defined in a perforated support substrate 32 are provided as taper holes whose diameters gradually increase as they extend from a first surface to a second surface. Thus, the metabolism of solvent in each hole 31 is improved, and an adhesive layer 36 for bonding the perforated support substrate 32 and a semiconductor wafer 30 to each other is melted in a shorter time, thus shortening the time required to separate the semiconductor wafer 30 from the perforated support substrate 32.

Fourth Embodiment

Figure 18:
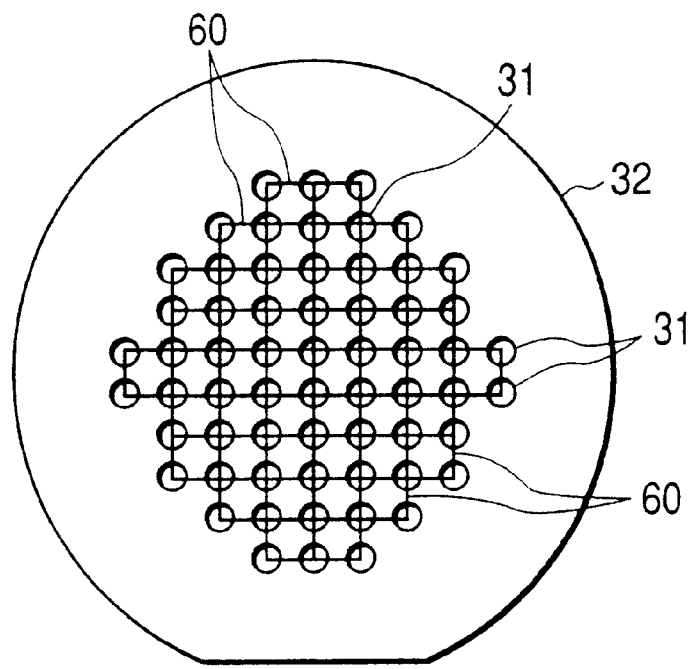
FIG. 18 is a typical plan view of a perforated support substrate used in a method of manufacturing a semiconductor device, according to a still further embodiment (fourth embodiment) of the present invention.

FIG. 18 is a typical plan view of a support substrate having holes used in a method of manufacturing a semiconductor device, according to a still further embodiment (fourth embodiment) of the present invention. As shown in FIG. 18, trenches 60 for allowing holes 31 to connect (communicate with) to a first surface thereof on which a semiconductor wafer is applied, are defined in a perforated support substrate 32 employed in the fourth embodiment in all directions. Since solvent can be transferred between the holes 31 through the trenches 60 in the present structure, an area where the solvent and an adhesive layer make contact with each other, increases, and the metabolism of the solvent is improved. Further, the adhesive layer is melted in a shorter time, whereby the time required to separate the semiconductor wafer from the perforated support substrate is shortened.

Fifth Embodiment

Figure 19:
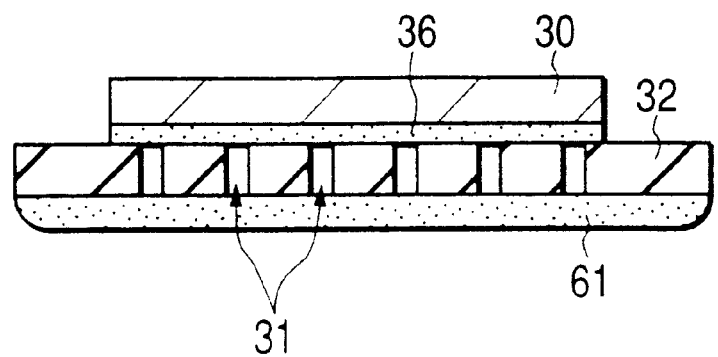
FIG. 19 is a typical plan view showing the state in which a wafer and a support substrate employed in a method of manufacturing a semiconductor device, according to a still further embodiment (fifth embodiment) of the present invention are applied to each other.

FIG. 19 is a diagram related to a method of manufacturing a semiconductor device, according to a still further embodiment (fifth embodiment) of the present invention. In the present embodiment, a semiconductor wafer 30 is applied to a first surface of a perforated support substrate 32 with an adhesive layer 36, and an adhesive layer 61 melted by solvent is formed on a second surface of the perforated support substrate 32. When the semiconductor wafer 30 is separated from the perforated support substrate 32, the adhesive layer 61 is melted by the solvent so as to disappear, and the solvent is supplied through the opened holes 31 to melt the adhesive layer 36, thereby separating the semiconductor wafer 30 from the support substrate 32. As the adhesive layer 61, may be used, for example, an acrylic resin melted by a resist (acqueous ammonia: NH$_4$OH)

In a manner similar to the respective embodiments even in the case of the present embodiment, the semiconductor wafer 30 can be separated from the perforated support substrate 32 in a short time without damage to the semiconductor wafer 30.

Sixth Embodiment

Figure 20:
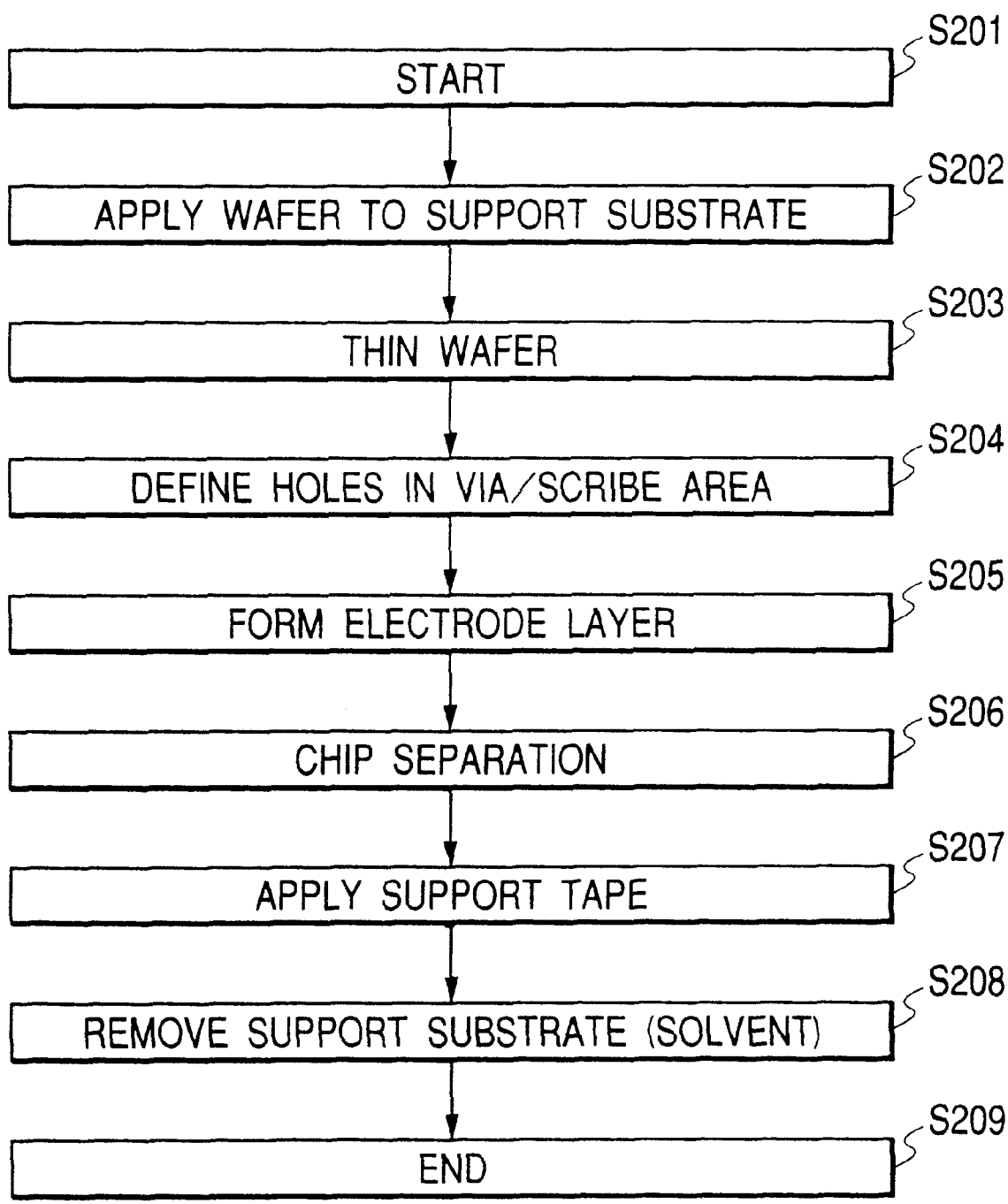
FIG. 20 is a flowchart showing a method of manufacturing a semiconductor device, according to a still further embodiment (sixth embodiment) of the present invention.
Figure 21:
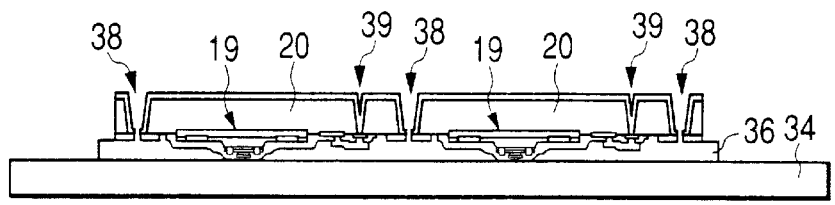
FIG. 21 is a cross-sectional view showing the state in which a metal layer formed on the back of a wafer is cut in dicing areas to provide chip separation in the manufacturing method according to the sixth embodiment.
Figure 22:
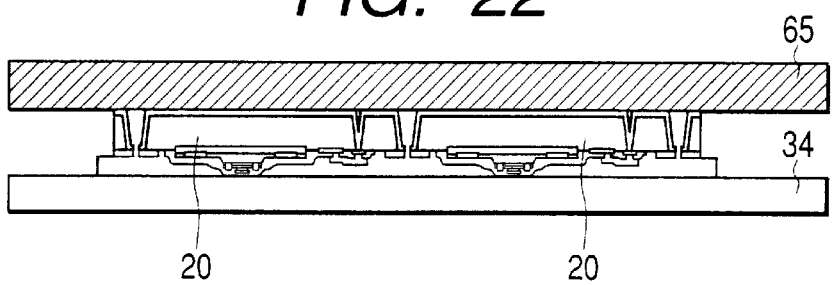
FIG. 22 is a cross-sectional view illustrating the state in which a support tape is applied onto a semiconductor chip group separated in the manufacturing method according to the sixth embodiment.
Figure 23:
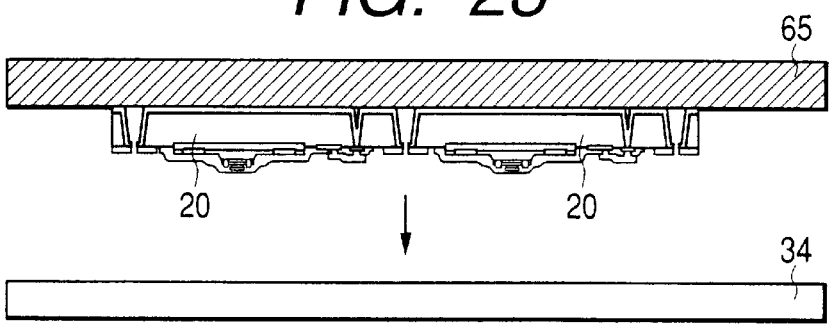
FIG. 23 is a cross-sectional view depicting the state in which a support substrate (hole-free support substrate) is separated from the semiconductor chip group in the manufacturing method according to the sixth embodiment.
Figure 24:
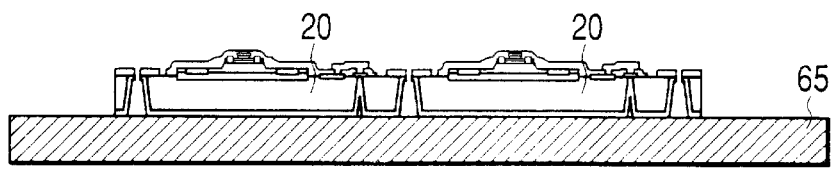
FIG. 24 is a cross-sectional view showing the semiconductor chip group applied to the support tape in the manufacturing method according to the sixth embodiment.

FIGS. 20 through 24 are respectively diagrams related to a method of manufacturing a semiconductor device, according to a still further embodiment (sixth embodiment) of the present invention. FIG. 20 is a flowchart showing the method of manufacturing the semiconductor device, FIG. 21 is a cross-sectional view showing the state in which a metal layer formed on the back of a wafer is cut off in dicing areas to provide chip separation, FIG. 22 is a cross-sectional view illustrating the state in which a support tape is applied onto the separated semiconductor chip group, FIG. 23 is a cross-sectional view depicting the state in which a support substrate (hole-free support substrate) is separated from the semiconductor chip group, and FIG. 24 is a cross-sectional view showing the semiconductor chip group applied to the support tape, respectively.

As shown in the flowchart of FIG. 20, the method of manufacturing the semiconductor device, according to the present embodiment follows process steps similar to the second embodiment as in the case of the bonding of a semiconductor wafer to a support substrate (hole-free support substrate) (S202) after work is started (S201), the thinning of the semiconductor wafer (S203), the definition of holes in a via/scribing area (S204), and the formation of an electrode layer (S205). However, the subsequent process steps are different from the second embodiment as in the case of the conversion into semiconductor chip form by chip separation (S206), support-tape bonding (S207) and the removal of a support substrate by solvent (S208). Afterwards, the work is finished (S209). In the sixth embodiment, the hole-free support substrate is used as the support substrate.

Points different from the method of manufacturing the semiconductor device, according to the second embodiment will be explained below with reference to FIGS. 21 through 24. In the present embodiment, a main surface of a semiconductor wafer 30 is bonded to a first surface of a hole-free support substrate 34 by an adhesive layer 36 so as to be opposed to each other as shown in FIG. 21. The adhesive layer 36 is an adhesive layer melted by solvent and makes use of wax in a manner similar to the second embodiment.

The semiconductor wafer 30 bonded to the hole-free support substrate 34 follows process steps similar to the second embodiment as in the case of the wafer thinning (S203), the definition of the holes in the via/scribing area (S204) and the formation of the electrode layer (S205).

Next, as shown in FIG. 21, an electrode layer 12 provided on the back of the semiconductor wafer is cut by dicing along the centers of separation trenches (first trenches) 38 to form semiconductor chips 20 (S206).

Next, as shown in FIG. 22, a support tape 65 is applied to the back of a semiconductor chip group attached to an adhesive layer 33 (S207). The support tape 65 is a resin tape having adhesion similar to that employed in the second embodiment.

Next, as shown in FIG. 23, the adhesive layer 36 for bonding the semiconductor chips 20 and the hole-free support substrate 34 to each other is melted by solvent to separate the semiconductor chips 20 from the hole-free support substrate 34 (S208). For example, a perforated support substrate 32 with the semiconductor chips 20 attached thereto is immersed in IPA (Isopropyl alcohol) to solve the adhesive layer 36. After IPS has reached the surface of the adhesive layer 36 through the separation trenches 38, it promotes melting toward the center of each semiconductor chip while the adhesive layer 36 lying on the periphery of each semiconductor chip 20 is being melted. At this time, ultrasonic vibrations are applied to accelerate the solving of the adhesive layer.

Since the semiconductor chip 20 is extremely small in size as compared with the semiconductor wafer, the time required for IPA to reach from the periphery of the semiconductor chip 20 to its center is drastically shortened as compared with the semiconductor wafer. As a result, the separation of the semiconductor chip group is greatly cut down as compared with a semiconductor wafer on which a semiconductor chip group is formed.

Since no external force is applied to each semiconductor chip 20, damage such as cracks, breaking is not developed in each semiconductor chip upon separation.

FIG. 24 is a diagram showing the semiconductor chips 20 kept in a state of being applied to the support tape 65.

Afterwards, the respective semiconductor chips 20 kept in the state of being attached to the support tape 65 are vacuum-absorbed and held by a normally-used vacuum absorption type pickup tool upon assembly of a semiconductor device such as a high-frequency power amplifying module. Thus, the semiconductor chips 20 are peeled off from the support tape 65 and chip-bonded to a mounted substrate.

The present embodiment can also obtain an effect similar to the second embodiment. Namely, the semiconductor chips 20 can be separated from the hole-free support substrate 34 in a short time without being subjected to damage.

While the invention made by the present inventors has been described above specifically based on the embodiments, the present invention is not limited to the above-described embodiments. It is needless to say that various changes can be made thereto without the scope not departing from the substance thereof. The present invention can similarly be applied even to a method of manufacturing semiconductor devices such as GaAs-MESFET, HEMT, etc. and can bring about effects similar to the embodiments.

Advantageous effects obtained by typical ones of the inventions disclosed in the present application will be explained as follows:

The thinning of a semiconductor wafer and the separation thereof from a support substrate can be carried out with high yields and in a short time, and hence a reduction in manufacturing cost of a semiconductor device can be achieved.

The thinning of a semiconductor wafer and the separation of each semiconductor chip from a support substrate can be carried out with high yields and in a short time, and hence a reduction in manufacturing cost of a semiconductor device can be achieved.

Thinned semiconductor chips each having a PHS structure can be manufactured with high yields and in a short time, and hence a reduction in manufacturing cost of a semiconductor device can be achieved.

What is claimed is:

1. A method of manufacturing a semiconductor device, comprising the steps of:
   a) preparing a support substrate having a first surface and a second surface opposite to the first surface and having a plurality of holes which extend from the first surface to the second surface;
   b) preparing a semiconductor wafer which has a main surface and a back opposite to the main surface and in which a plurality of semiconductor elements are formed;
   c) fixing the main surface of the semiconductor wafer to the first surface of the support substrate with a first adhesive layer in an area in which the plurality of holes of the support substrate are defined;
   d) removing the back of the semiconductor wafer by a predetermined thickness to thereby thin the thickness of the semiconductor wafer;
   e) supplying solvent from the second surface of the support substrate through the plurality of holes to thereby reduce adhesive power of said first adhesive layer; and
   f) peeling the thinned semiconductor wafer from the support substrate;
   wherein in said step c), a second adhesive layer melted by solvent is formed on the second surface of the support substrate having the holes so as to block the holes.

2. The method according to claim 1, wherein said holes are arranged in said support substrate so as not to exist in the edge of said semiconductor wafer and outside it.

3. The method according to claim 1,
   in said step e), the adhesive layer formed on the second surface of the support substrate having the holes is melted by solvent so as to disappear, and thereafter solvent is supplied from the second surface of the support substrate through the plurality of holes to thereby reduce adhesive power of the adhesive layer for bonding the support substrate having the holes and the semiconductor wafer to each other.

4. The method according to claim 1, further including, after said step d), a step of selectively etching the semiconductor wafer from the back thereof to divide the semiconductor wafer into semiconductor chip forming areas including the semiconductor elements to thereby form a plurality of semiconductor chips.

5. The method according to claim 4, further including the steps of:
   preparing a semiconductor wafer having a main surface and a back opposite to the main surface, having a plurality of semiconductor elements formed thereon, and having, on the main surface, an etching stopper layer comprised of a conductor electrically connected to a predetermined electrode constituting said each semiconductor element, and a metal layer provided so as to overlap with a corresponding scribing area around said each semiconductor chip forming area;
   defining first trenches each of which reaches the metal layer in the scribing area and second trenches each of which reaches the etching stopper layer in said step of selectively etching the semiconductor wafer from the back thereof;
   forming an electrode layer over the whole range of the back of the semiconductor wafer; and
   supplying solvent from the second surface of the support substrate through the plurality of holes to thereby reduce adhesive power of said first adhesive layer for bonding the support substrate and the semiconductor wafer to each other.

6. The method according to claim 1, wherein the removal of said step d) includes a step of grinding the back of the semiconductor wafer, and a step of further wet-etching the surface thereof exposed by said grinding.

7. The method according to claim 1, wherein the holes defined in the support substrate gradually increase in diameter from the first surface to the second surface.

8. The method according to claim 1, wherein the respective holes defined in the support substrate are connected through trenches.

9. The method according to claim 1, wherein in said step e), solvent is supplied from the second surface of the support substrate through the plurality of holes while a ultrasonic wave is being applied, to thereby reduce adhesive power of said first adhesive layer for bonding the support substrate and the semiconductor wafer to each other.

10. The method according to claim 1, wherein the support substrate is formed of glass.

11. The method according to claim 1, wherein in said step c), a hole-free support substrate is bonded to the second surface of the support substrate having the holes with said second adhesive layer melted by heating so as to block the holes, and thereafter the main surface of the semiconductor wafer is fixed to the first surface of the support substrate with an adhesive layer melted by solvent, and
   in said step e), said second adhesive layer for bonding the support substrate having the holes and the hole-free support substrate to each other is melted by heating to thereby separate the hole-free support substrate from the support substrate having the holes, and thereafter solvent is supplied from the second surface of the support substrate through the plurality of holes to thereby reduce adhesive power of said first adhesive layer for bonding the support substrate having the holes and the semiconductor wafer to each other.

12. The method according to claim 11, wherein one ends of said holes are blocked by said hole-free support substrate, whereas the other ends thereof are blocked by said semiconductor wafer.

13. A method of manufacturing a semiconductor device, comprising the steps of:
   a) preparing a support substrate having a first surface and a second surface opposite to the first surface and having a plurality of holes which extend from the first surface to the second surface;
   b) preparing a semiconductor wafer which has a main surface and a back opposite to the main surface and in which a plurality of semiconductor elements are formed;
   c) fixing the main surface of the semiconductor wafer to the first surface of the support substrate with a first adhesive layer in an area in which the plurality of holes of the support substrate are defined;
   d) bonding a hole-free support substrate to the second surface of the support substrate having the holes with a second adhesive layer so as to block the holes;
   e) removing the back of the semiconductor wafer by a predetermined thickness to thereby thin the thickness of the semiconductor wafer;
   f) melting said second adhesive layer by heating to thereby separate the hole-free support substrate from the support substrate having the holes;
   g) supplying solvent from the second surface of the support substrate through the plurality of holes to thereby reduce adhesive power of said first adhesive layer; and
   h) peeling the thinned semiconductor wafer from the support substrate.

14. A method of manufacturing a semiconductor device, comprising the steps of:
   a) preparing a support substrate having a first surface and a second surface opposite to the first surface and having a plurality of holes which extend from the first surface to the second surface;
   b) preparing a semiconductor wafer having a main surface and a back opposite to the main surface, having a plurality of semiconductor elements formed thereon, and having, on the main surface, an etching stopper layer comprised of a conductor electrically connected to a predetermined electrode constituting said each semiconductor element, and a metal layer provided so as to overlap with a corresponding scribing area around each of semiconductor chip forming areas including the semiconductor elements;
   c) fixing the main surface of the semiconductor wafer to the first surface of the support substrate with a first adhesive layer;
   d) removing the back of the semiconductor wafer by a predetermined thickness to thereby thin the thickness of the semiconductor wafer;
   e) forming an etching mask for exposing parts of an area corresponding to the scribing area and said plurality of semiconductor chip forming areas on the back of the thinned semiconductor wafer; and
   f) selectively etching the semiconductor wafer in an area corresponding to the scribing area exposed from the etching mask and an area corresponding to part of said plurality of semiconductor chip forming areas to thereby form first trenches reaching the metal layer in the area corresponding to the scribing area and second trenches in each individuals of the plurality of semiconductor chip forming areas;
   wherein in said step c), a second adhesive layer melted by solvent is formed on the second surface of the support substrate having the holes so as to block the holes, and the main surface of the semiconductor wafer is fixed to the first surface of the support substrate.

15. The method according to claim 14, wherein in said step a), a support substrate having a plurality of holes extending from the first surface to the second surface of the support substrate is prepared as a support substrate, and in said step c), the main surface of the semiconductor wafer is fixed to the first surface of the support substrate with said first adhesive layer in an area in which the plurality of holes are defined in the support substrate.

16. The method according to claim 14, wherein a hole-free support substrate is bonded to a second surface of the support substrate having the holes with a second adhesive layer melted by heating so as to block the holes.

17. The method according to claim 15, wherein said second adhesive layer melted by solvent is formed on the second surface of the support substrate having the holes so as to block the holes.

18. The method according to claim 14, wherein the removal of said step d) includes a step of grinding the back of the semiconductor wafer, and a step of further wet-etching the surface thereof exposed by said grinding.

19. A method of manufacturing a semiconductor device, comprising the steps of:
   a) preparing a support substrate having a first surface and a second surface opposite to the first surface and having a plurality of holes extending from the first surface to the second surface;
   b) preparing a semiconductor wafer having a main surface and a back opposite to the main surface, having a plurality of semiconductor elements formed thereon, and having, on the main surface, an etching stopper layer comprised of a conductor electrically connected to a predetermined electrode constituting said each semiconductor element, and a metal layer provided so as to overlap with a corresponding scribing area around each of the semiconductor elements;
   c) fixing the main surface of the semiconductor wafer to the first surface of the support substrate with a first adhesive layer in an area in which the plurality of holes are defined;
   d) removing the back of the semiconductor wafer by a predetermined thickness to thereby thin the thickness of the semiconductor wafer;
   e) selectively etching the back of the semiconductor wafer to thereby define first trenches each of which reaches the metal layer in the scribing area and second trenches each of which reaches the etching stopper layer;
   f) forming an electrode layer over the whole range of the back of the semiconductor wafer;
   g) supplying solvent from the second surface of the support substrate through the plurality of holes to thereby reduce adhesive power of said first adhesive layer for bonding the support substrate and the semiconductor wafer to each other;
   h) peeling a semiconductor chip group arranged in plate form, which is connected by the electrode layer, from the support substrate;
   i) bonding a support tape to the electrode layer forming surface side of the semiconductor chip group arranged in plate form; and j) cutting the electrode layer for connecting respective semiconductor chips of the semiconductor chip group arranged in plate form to thereby separate each individual semiconductor chip;

wherein in said step c), a second adhesive layer melted by solvent is formed on the second surface of the support substrate having the holes so as to block the holes, and the main surface of the semiconductor wafer is fixed to the first surface of the support substrate.

20. The method according to claim 19, further including a step of bonding an insulating support tape to one exposed surface of the semiconductor chip group arranged in plate form in said step i) and thereafter inspecting electrical characteristics of the respective semiconductor chips.

21. The method according to claim 19, wherein in said step c), a hole-free support substrate is bonded to the second surface of the support substrate having the holes with a second adhesive layer melted by heating so as to block the holes and thereafter the main surface of the semiconductor wafer is fixed to the first surface of the support substrate with an adhesive layer melted by solvent, and in said step g), said second adhesive layer for bonding the support substrate having the holes and the hole-free support substrate to each other is melted by heating to thereby separate the hole-free support substrate from the support substrate having the holes, and thereafter solvent is supplied from the second surface of the support substrate through the plurality of holes to thereby reduce adhesive power of said first adhesive layer for bonding the support substrate having the holes and the semiconductor wafer to each other.

22. The method according to claim 19, in said step g), said first adhesive layer formed on the second surface of the support substrate having holes is melted by solvent so as to disappear, and thereafter solvent is supplied from the second surface of the support substrate through the plurality of holes to thereby reduce adhesive power of said first adhesive layer for bonding the support substrate having the holes and the semiconductor wafer to each other.

23. The method according to claim 19, wherein the removal of said step d) includes a step of grinding the back of the semiconductor wafer, and a step of further wet-etching the surface thereof exposed by said grinding.

24. The method according to claim 19, wherein said support substrate is formed of glass.

25. The method according to claim 19, wherein said support tape is an insulating ultraviolet-ray cured adhesion type resin tape.

26. A method of manufacturing a semiconductor device, comprising the steps of:
  a) preparing a support substrate having a first surface and a second surface opposite to the first surface and having a plurality of holes extending from the first surface to the second surface;
  b) preparing a semiconductor wafer having a main surface and a back opposite to the main surface, having a plurality of semiconductor elements formed thereon, and having, on the main surface, an etching stopper layer comprised of a conductor electrically connected to a predetermined electrode constituting said each semiconductor element, and a metal layer provided so as to overlap with a corresponding scribing area around semiconductor elements;
  c) fixing the main surface of the semiconductor wafer to the first surface of the support substrate with a first adhesive layer;
  d) removing the back of the semiconductor wafer by a predetermined thickness to thereby thin the thickness of the semiconductor wafer;
  e) selectively etching the back of the semiconductor wafer to thereby define first trenches each of which reaches the metal layer in the scribing area and second trenches each of which reaches the etching stopper layer;
  f) forming an electrode layer over the whole range of the back of the semiconductor wafer;
  g) cutting the metal layer in the scribing area to thereby set the respective semiconductor elements as semiconductor chips independent of one another on the support substrate;
  h) applying a support tape to the electrode layer forming surface side of said each semiconductor chip; and
  i) melting said first adhesive layer for bonding the support substrate and the respective semiconductor chips to one another by solvent to separate the support substrate from the semiconductor chips;

wherein in said step c), a second adhesive layer melted by solvent is formed on the second surface of the support substrate having the holes so as to block the holes, and the main surface of the semiconductor wafer is fixed to the first surface of the support substrate.

27. The method according to claim 26, wherein the removal of said step d) includes a step of grinding the back of the semiconductor wafer, and a step of further wet-etching the surface thereof exposed by said grinding.

28. The method according to claim 26, wherein said support substrate is formed of glass.

29. The method according to claim 26, wherein said support tape is an insulating ultraviolet-ray cured adhesion type resin tape.

30. A method of manufacturing a semiconductor device, comprising the steps of:
  a) preparing a support substrate having a first surface and a second surface opposite to the first surface and having a plurality of holes which extend from the first surface to the second surface;
  b) preparing a semiconductor wafer which has a main surface and a back opposite to the main surface and in which a plurality of semiconductor elements are formed;
  c) fixing the main surface of the semiconductor wafer to the first surface of the support substrate with a first adhesive layer in an area in which the plurality of holes of the support substrate are defined;
  d) removing the back of the semiconductor wafer by a predetermined thickness to thereby thin the thickness of the semiconductor wafer;
  e) forming an electrode layer over the back of the semiconductor wafer by a plating method using a plating solution;
  f) supplying solvent from the second surface of the support substrate through the plurality of holes to thereby reduce adhesive power of said first adhesive layer; and
  g) peeling the thinned semiconductor wafer from the support substrate;

wherein, in said step e), said holes are not exposed to said plating solution.

31. A method of manufacturing a semiconductor device including an HBT having a base electrode, a collector electrode and an emitter electrode, comprising the steps of:
  a) preparing a support substrate having a first surface and a second surface opposite to the first surface and having a plurality of holes extending from the first surface to the second surface;

b) preparing a semiconductor wafer having a main surface and a back opposite to the main surface, having a plurality of semiconductor elements formed thereon, and having, on the main surface, an etching stopper layer comprised of a conductor electrically connected to a predetermined electrode constituting said each semiconductor element, and a metal layer provided so as to overlap with a corresponding scribing area around semiconductor elements;

c) fixing the main surface of the semiconductor wafer to the first surface of the support substrate with a first adhesive layer;

d) removing the back of the semiconductor wafer by a predetermined thickness to thereby thin the thickness of the semiconductor wafer;

e) selectively etching the back of the semiconductor wafer to thereby define first trenches each if which reaches the metal layer in the scribing area and second trenches each of which reaches the etching stopper layer;

f) forming an electrode layer over the whole range of the back of the semiconductor wafer;

g) melting said first adhesive layer for bonding the support substrate and the respective semiconductor chips to one another by solvent to separate the support substrate from the semiconductor chips;

wherein in said step c), a second adhesive layer melted by solvent is formed on the second surface of the support substrate having the holes so as to block the holes, and the main surface of the semiconductor wafer is fixed to the first surface of the support substrate; and wherein in said step f), said electrode layer and said emitter electrode of said HBT are electrically connected.

* * * * *